United States Patent
Shin et al.

(10) Patent No.: US 7,941,612 B2
(45) Date of Patent: May 10, 2011

(54) MULTIPATH ACCESSIBLE SEMICONDUCTOR MEMORY DEVICE WITH HOST INTERFACE BETWEEN PROCESSORS

(75) Inventors: Yun-Hee Shin, Gyeonggi-do (KR);
Han-Gu Sohn, Gyeonggi-do (KR);
Young-Min Lee, Gyeonggi-do (KR);
Dong-Hyuk Lee, Seoul (KR);
Jong-Wook Park, Gyeonggi-do (KR);
Ho-Cheol Lee, Gyeonggi-do (KR);
Mi-Jo Kim, Gyeonggi-do (KR);
Jung-Sik Kim, Gyeonggi-do (KR);
Chang-Ho Lee, Gyeonggi-do (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 926 days.

(21) Appl. No.: 11/829,859

(22) Filed: Jul. 27, 2007

(65) Prior Publication Data

US 2008/0077937 A1    Mar. 27, 2008

(30) Foreign Application Priority Data

Jul. 28, 2006    (KR) .................. 10-2006-0071455
Nov. 15, 2006    (KR) .................. 10-2006-0112557
Nov. 15, 2006    (KR) .................. 10-2006-0112559

(51) Int. Cl.
*G06F 12/00* (2006.01)

(52) U.S. Cl. ............... 711/147; 711/154; 711/E12.002; 365/230.05; 719/312

(58) Field of Classification Search ............. 711/147, 711/148, 154, 111, E12.002; 718/102; 370/254; 709/102; 365/230.05; 712/23, E9.023; 719/312
See application file for complete search history.

(56) References Cited

U.S. PATENT DOCUMENTS

| 5,398,211 | A | 3/1995 | Willenz et al. |
| 5,946,262 | A | 8/1999 | Randolph et al. |
| 5,991,275 | A * | 11/1999 | Abiven et al. ............. 370/254 |
| 6,445,638 | B1 | 9/2002 | Hsu et al. |
| 6,460,120 | B1 | 10/2002 | Bass et al. |
| 6,938,253 | B2 * | 8/2005 | Kim ............................ 718/102 |
| 2002/0165896 | A1 * | 11/2002 | Kim ............................ 709/102 |
| 2003/0093628 | A1 | 5/2003 | Matter et al. |
| 2008/0170460 | A1 * | 7/2008 | Oh et al. ..................... 711/149 |
| 2008/0282042 | A1 * | 11/2008 | Kwon et al. ................ 711/147 |

FOREIGN PATENT DOCUMENTS

WO    2005/101417    10/2005

OTHER PUBLICATIONS

Chinese Office Action issued Feb. 12, 2010 in CN Application No. 200710136795.9.

* cited by examiner

*Primary Examiner* — Pierre-Michel Bataille
(74) *Attorney, Agent, or Firm* — Stanzione & Kim, LLP

(57) ABSTRACT

A multipath accessible semiconductor memory device provides an interface function between processors. The memory device may include a memory cell array having a shared memory area operationally coupled to two or more ports that are independently accessible by two or more processors, an access path forming unit to form a data access path between one of the ports and the shared memory area in response to external signals applied by the processors, and an interface unit having a semaphore area and mailbox areas accessible in the shared memory area by the two or more processors to provide an interface function for communication between the two or more processors.

37 Claims, 18 Drawing Sheets

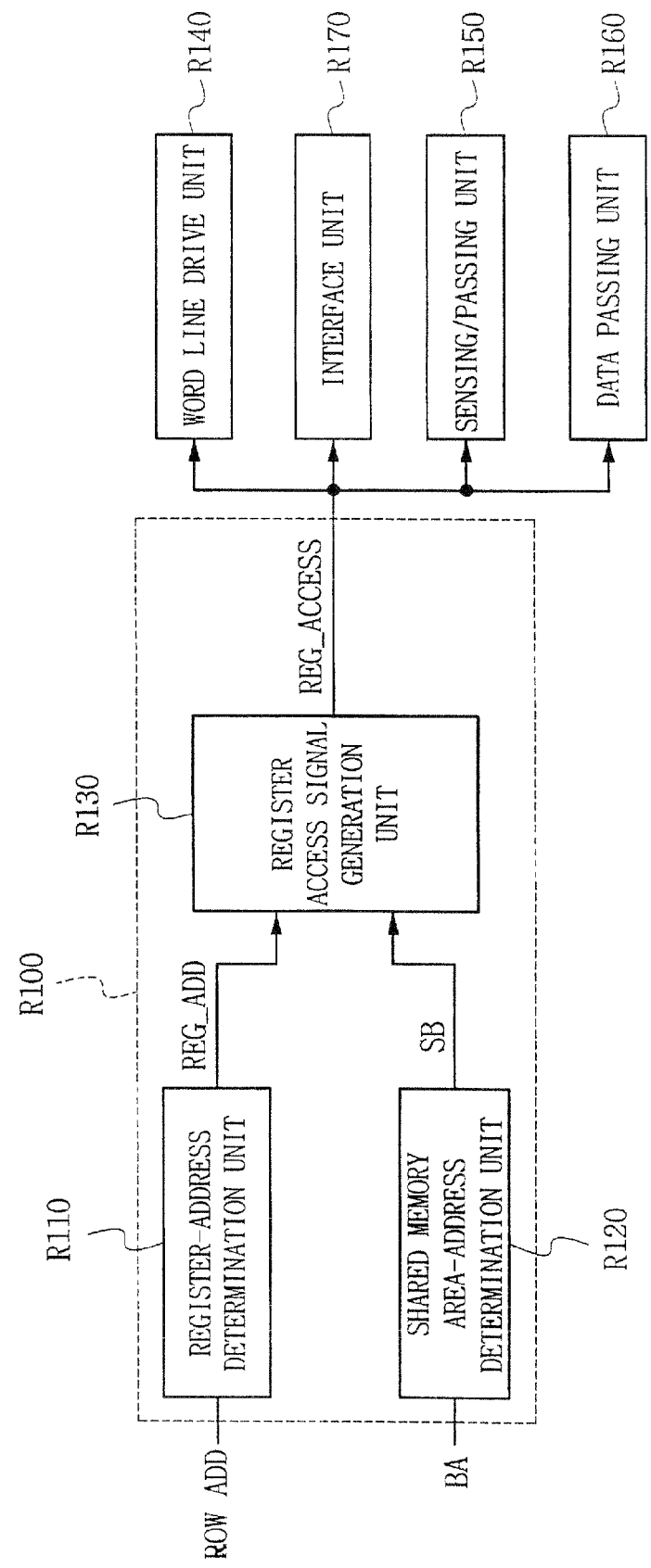

MULTIPATH ACCESSIBLE
SEMICONDUCTOR MEMORY DEVICE WITH
HOST INTERFACE BETWEEN PROCESSORS

This non-provisional application claims the priority of Korean Priority Document Nos. 2006-0071455, filed on Jul. 28, 2006, 2006-112557 filed on Nov. 15, 2006 and 2006-112559 filed on Nov. 15, 2006 in the Korean Intellectual Property Office, the contents of which are incorporated herein by reference.

BACKGROUND

1. Field of the Invention

The present invention relates to semiconductor memory devices, and more particularly, to a multipath accessible semiconductor memory device with a host interface between processors.

2. Description of the Related Art

In general a semiconductor memory device having more than one access port is called a multiport memory, and in particular a memory device having two access ports is called a dual-port memory. A typical dual-port memory is well known and used, for example, as an image processing video memory having a RAM (random access memory) port accessible in a random sequence and a SAM (serial access memory) port accessible only in a serial sequence.

Another type of multiport memory includes an array of memory cells, e.g., DRAM (dynamic random access memory) cells, that can be accessed randomly through two or more ports. This type of devices will be referred to as a multipath accessible semiconductor memory device in order to distinguish it from a multiport memory in which one of the ports only allows serial access.

In recently developed portable electronic systems, for example, handheld multimedia players or handheld phones or PDAs, etc., manufacturers have realized and produced products with multiprocessor systems that employ two or more processors as shown in FIG. 1 to achieve high speed and smooth operation.

Referring to FIG. 1, a first processor 10 and a second processor 12 are connected through a connection line L10. A NOR memory 14 and a DRAM 16 are coupled to the first processor 10 through determined buses B1-B3, and a DRAM 18 and a NAND memory 20 are coupled to the second processor 12 through determined buses B4-B6. The first processor 10 may perform a MODEM function for modulation and demodulation of a communication signal, and the second processor 12 may perform an application function such as processing communication data, games, entertainment, etc. The NOR memory 14 has a cell array configured in a NOR structure, and the NAND memory 20 has a cell array configured in a NAND structure. Both the NOR and NAND memories are nonvolatile memories having transistor memory cells with floating gates. The nonvolatile memories store data that must be retained even if power is turned off, for example, particular codes of handheld instruments and storage data. The DRAMs 16 and 18 function as main memories for the processors, but they loose their data if power is turned off.

In a multi processor system like the one shown in FIG. 1, a DRAM is allocated to every processor, and an interface such as a UART, SPI, or SRAM, all having relatively low speed, is used for communication between the processors over connection line L10. Thus, it is difficult to guarantee a satisfactory data transmission speed, and the complexity, size and expense of the memory configuration increases. Thus a scheme as shown in FIG. 2 has been developed to reduce the size, increase the data transmission speed, and reduce the number of DRAMs.

In the system of FIG. 2, as compared with the system of FIG. 1, one DRAM 17 is coupled to first and second processors 10 and 12 through buses B1 and B2. For both processors to access the one DRAM through two paths as shown in FIG. 2, the DRAM must have two ports to connect to the corresponding buses B1 and B2. However, as shown in FIG. 3, a general DRAM is a memory 1 having a single port PO.

Referring to FIG. 3 which shows the structure of a general DRAM, a memory cell array includes first to fourth banks 3, 4, 5 and 6, each corresponding to and connected to a row decoder 8 and a column decoder 7. An upper input/output sense amplifier and driver 13 is operationally coupled to the first bank 3 or third bank 5 through multiplexers 11, 12, and a lower input/output sense amplifier and driver 13 is operationally coupled to the second bank 4 or fourth bank 6 through multiplexers 14, 15. For example, in selecting a memory cell of the first bank 3 and in reading data stored in the selected memory cell, an output procedure to read the data will be described as follows. A selected word line is activated, and data in the memory cell is sensed and amplified by a bit line sense amplifier and then transferred to a local input/output line 9 according to an activation of corresponding column selection line. Data transferred to the local input/output line 9 is transferred to a global input/output line GIO by a switching operation of first multiplexer 21, and a second multiplexer 11 connected to global input/output line GIO transfers data from the global input/output line GIO to the upper input/output sense amplifier and driver 13. Data is again sensed and amplified by the upper input/output sense amplifier and driver 13 and is then output to a data output line L5 through a path unit 16. Meanwhile, in reading data stored in a memory cell of the fourth bank 6, the data is output to an output terminal DQ through a multiplexer 24, the multiplexer 14, the lower input/output sense amplifier and driver 13, the path unit 16 and the data output line L5, in that order. As described above, the DRAM 1 of FIG. 3 has a structure in which two banks share one input/output sense amplifier and driver, and is a single port memory in which data is input/output through one port PO. That is, the DRAM 1 of FIG. 3 is only applicable to the system of FIG. 1, and is inapplicable to a multiprocessor system like in FIG. 2 due to the structure of the memory bank and port.

In an effort to realize a memory adequate for a multiprocessor system like in FIG. 2, a prior art system having a configuration shown FIG. 4, in which a shared memory area can be accessed by a plurality of processors, is disclosed in US Publication No. US2003/0093628.

Referring to FIG. 4 which illustrates a multiprocessor system 50, a memory array 35 is constructed of first, second and third portions. The first portion 33 of the memory array 35 is accessed only by a first processor 70 through a port 37, the second portion 31 is accessed only by a second processor 80 through a port 38, and the third portion 32 is accessed by both of the first and second processors 70 and 80. The size of the first and second portions 33 and 31 of the memory array 35 may be flexibly changed depending upon an operating load of the first and second processors 70 and 80, and the memory array 35 may be realized by any type of memory or disk storage.

To realize the third portion 32 shared by the first and second processors 70 and 80 within the memory array 35 of a DRAM, some technical challenges must be overcome. For example, it is very important to properly layout the memory areas within the memory array 35 and input/output sense amplifiers, and to provide an adequate technique for read/write path control of each port.

Moreover, in conventional communication between processors, for example, between a MODEM and an application processor or multimedia coprocessor, a UART, SPI or SRAM interface has been used, thereby causing problems such as low operating speed, an increase in the number of pins, etc. In particular, to adequately realize a three-dimensional game or image communication, HDPDA, wibro, etc., data traffic between a MODEM and a processor must increase, so the need for a high speed-interface between processors is increasing.

Thus, better solutions are needed to the problems caused by low-speed communication interfaces and shared memory area allocated within a DRAM memory cell array.

SUMMARY

Some embodiments of the invention provide a multiprocessor system capable of smoothly accessing to a shared memory area of a DRAM memory cell array.

Some embodiments of the invention provide a multipath accessible semiconductor memory device which has a memory area shared by two or more processors and which is capable of providing a DRAM interface to the processors instead of an interface external to a memory. In addition, data communication between processors can be performed at high speed by using a shared memory area and an interface unit responding to a specific address that indicates a portion of the shared memory area.

Some embodiments of the invention provide a multiprocessor system or DRAM which variably allocates a row address for enabling a predetermined word line of a shared memory area to a register within a DRAM chip, so that a corresponding processor can recognize permission to use a shared memory area for a host interface, a permission request for gaining the permission, and a data transfer message through the allocation of the row address.

Some embodiments of the invention provide a multipath accessible semiconductor memory device and an interface method between processors which are capable of performing an interface without using a host interface external to a memory when two or more processors share a shared memory area.

According to some embodiments of the invention, a semiconductor memory device includes a memory cell array having a shared memory area operationally coupled to two or more ports that are independently accessible by two or more processors, an access path forming unit to form a data access path between one of the ports and the shared memory area in response to external signals applied by the processors, and an interface unit having a semaphore area and mailbox areas accessible in the shared memory area by the two or more processors to provide an interface function for communication between the two or more processors.

According to some embodiments of the invention, a portable communication system includes a first processor for performing a first determined task, a second processor for performing a second determined task, and a random access memory including a memory cell array, first and second ports, an access path forming unit and a register unit, the memory cell array having a shared memory area accessible by both the first and second processors and first and second private memory areas accessible only by the respective first and second processors, the first and second ports each coupled to corresponding buses of the first and second processors, the access path forming unit to form a data access path between one of the ports and the shared memory area in response to external signals applied from the first and second processors, and the register unit having a semaphore area and mailbox areas opposedly accessible to provide an interface function for communication between the first and second processors.

According to some embodiments of the invention, a method for providing a host interface between processors includes coupling the processors to a multipath accessible semiconductor memory device having a shared memory area, and performing data communication between the processors through an interface unit having a semaphore area and mailbox areas commonly accessible by the processors. In some embodiments, the shared memory area may be accessed only by one of the processors that has gained control authority for the shared memory area, and the mailbox areas may be accessed at any time by both of the processors regardless of the control authority.

According to another embodiment of the invention, a semiconductor memory device comprises at least one memory cell array having a shared memory area operationally coupled to two or more ports that are independently accessible by two or more processors; and an interface unit having a semaphore area, mail box areas and check areas which are individually accessed in response to a specific address of the shared memory area so as to provide an interface function for communication between the processors.

According to another embodiment of the invention, a semiconductor memory device comprises at least one memory cell array having a shared memory area operationally coupled to two or more ports that are independently accessible by two or more processors; and an interface unit having a semaphore area and mail box areas which are individually accessible to provide an interface function for communication between the processors, wherein the interface unit provides a first interrupt signal to a first one of the ports and a corresponding first check signal to a second one of the ports, and the interface unit provides a second interrupt signal to the second one of the ports and a corresponding second check signal to the first one of the ports.

According to some embodiments of the invention described above, a plurality of processors can access an allocated shared memory area at high speed by providing a host interface between processors through the interior of a memory. Accordingly, data transmission and processing speed can be enhanced, the size of system can be reduced, and the number of memories can be reduced, thereby substantially reducing a cost for memories in the system.

BRIEF DESCRIPTION OF THE DRAWINGS

The above and other features of some embodiments of the invention will become readily apparent from the description that follows, with reference to the attached drawings in which:

FIG. 18 is a block diagram illustrating an embodiment of the register access circuit of the DRAM of FIG. 5.

DETAILED DESCRIPTION

Embodiments of the present invention now will be described more fully hereinafter with reference to FIGS. 5 to 18, in which example embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 5 to 18. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

A multipath accessible semiconductor memory device having an interface function between processors according to some embodiments of the invention will be described referring to the accompanied drawings, as follows.

Figure 1:
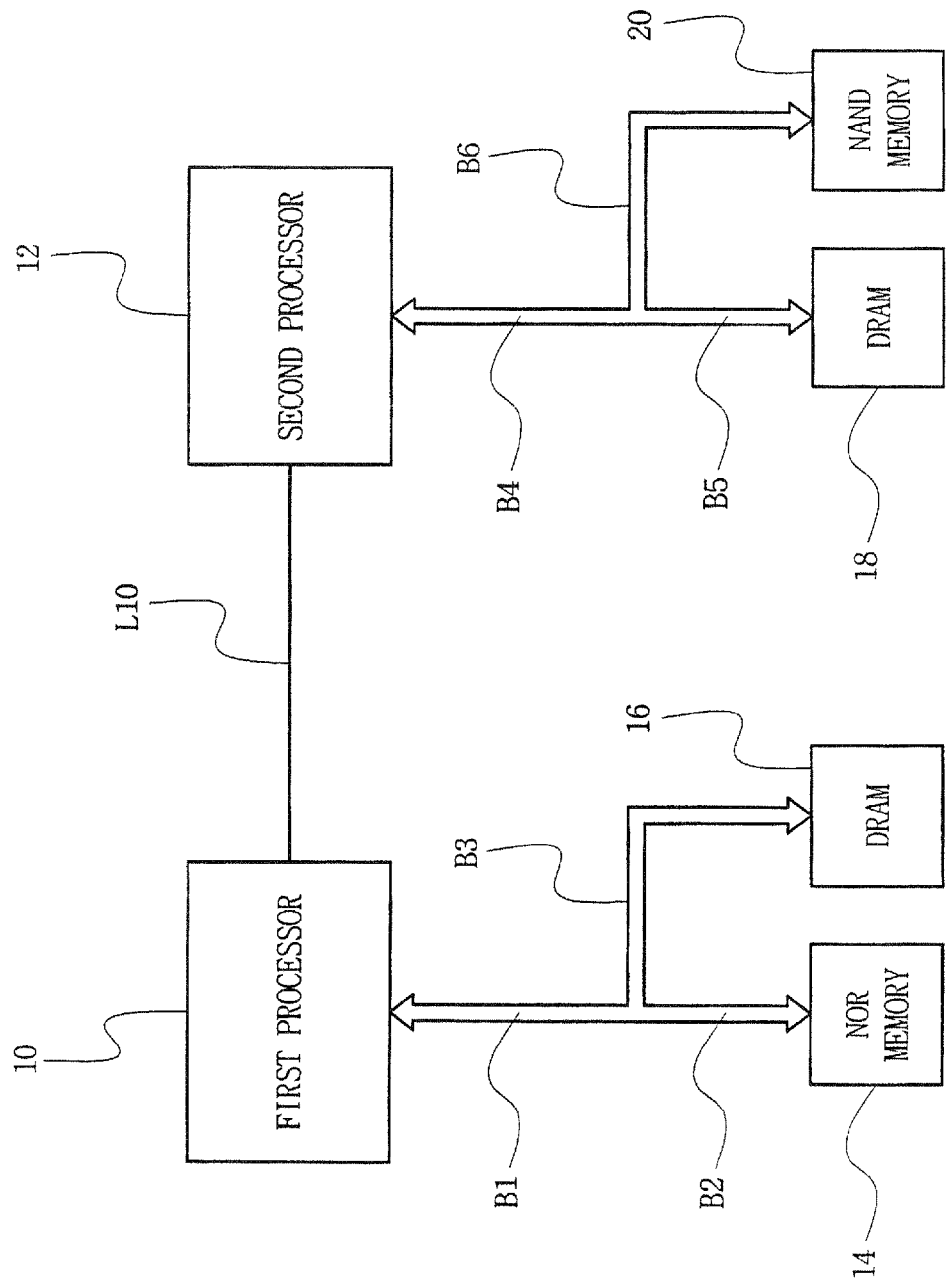
FIG. 1 is a block diagram of a conventional multiprocessor system employed in a portable communication device.
Figure 2:
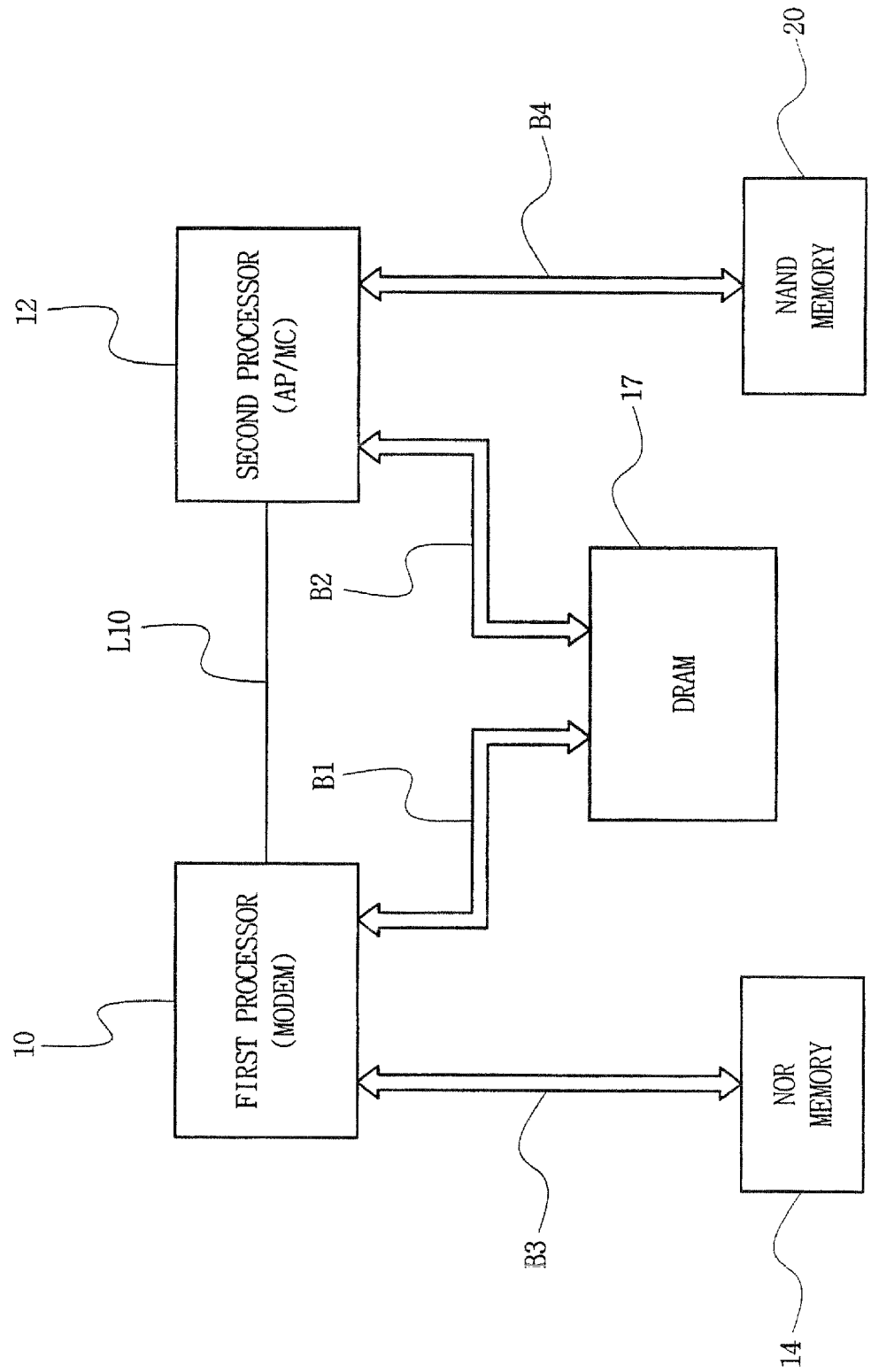
FIG. 2 is a block diagram of a conventional multiprocessor system employing a multipath accessible memory.
Figure 3:
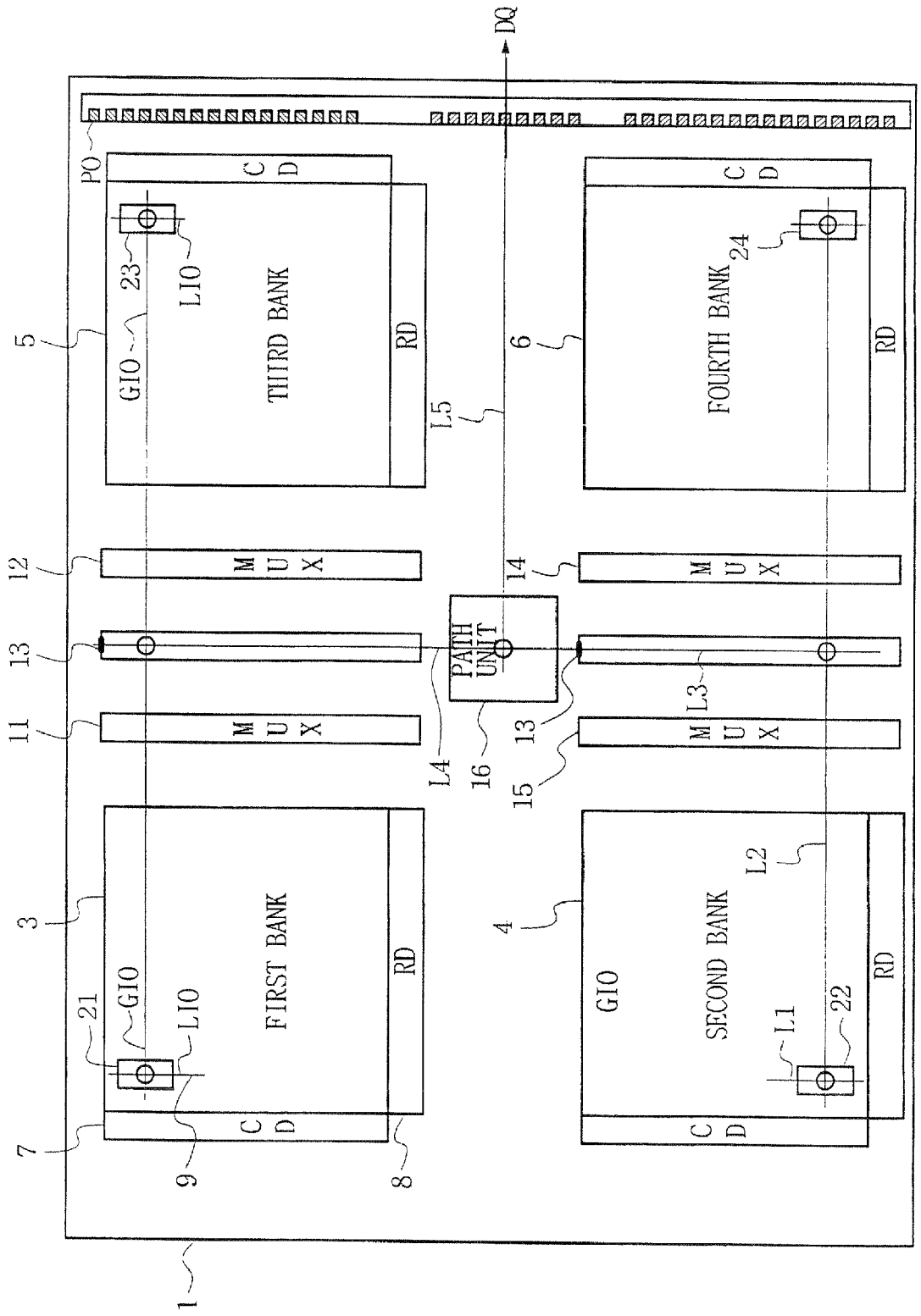
FIG. 3 is a block diagram illustrating an input/output path structure of a conventional DRAM.
Figure 4:
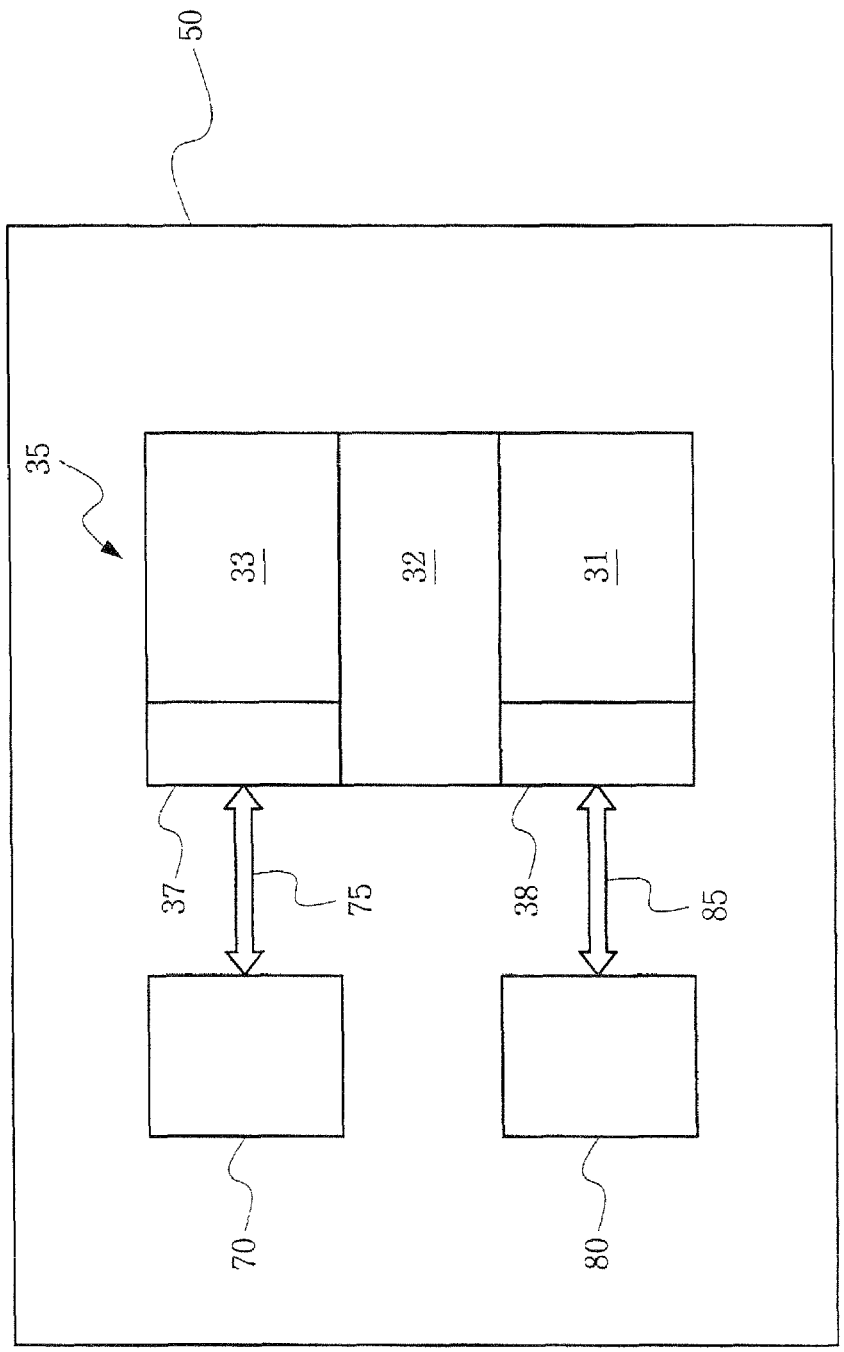
FIG. 4 is a block diagram illustrating memory array portions of a conventional multiprocessor system.
Figure 5:
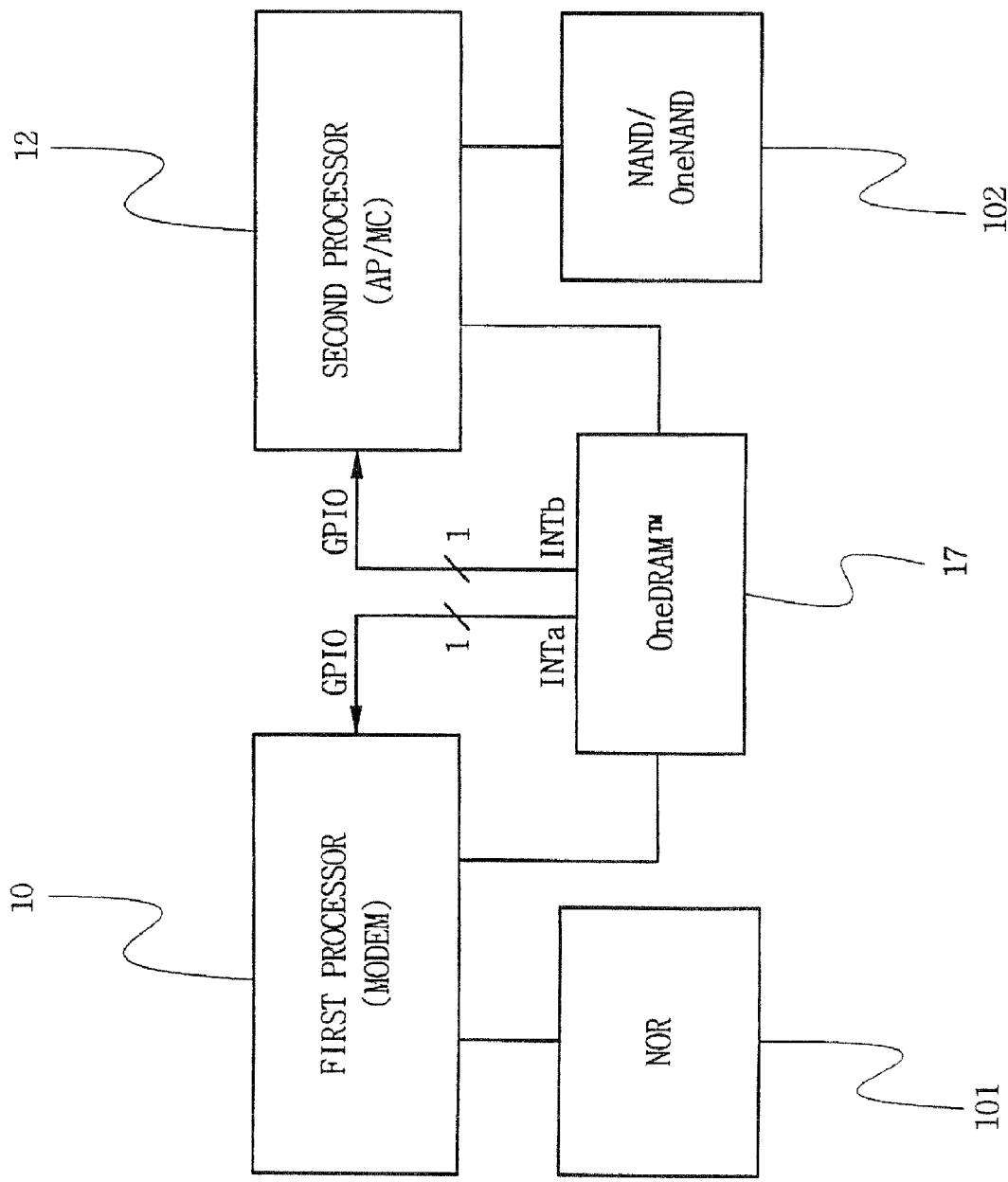
FIG. 5 is a block diagram of multiprocessor system having a multipath accessible DRAM according to some embodiments of the invention.

FIG. 5 is a block diagram of multiprocessor system having a multipath accessible DRAM according to some embodiments of the invention. Referring to FIG. 5, a portable communication system includes a first processor 10 for performing a first determined task, a second processor 12 for performing a second determined task, and a DRAM 17 having memory areas accessed by the first and second processors 10 and 12 within a memory cell array. The portable communication system further includes flash memories 101 and 102 coupled to the first and second processors 10, 12 through separate buses.

In this example, the DRAM 17 is illustrated as a dual port combined SRAM and DRAM such as Samsung's One-DRAM™ device, but the inventive principles are applicable to other types of dual port RAM devices.

A port A through which an output signal INTa is output is herein called a first port and a port B through which an output signal INTb is output is called a second port. The first port is connected to the first processor 10 through a general purpose input/output (GPIO) line, and the second port is connected to the second processor 12 through a general purpose input/output (GPIO) line. The first processor 10 may have, as a processing task, a MODEM function, i.e., modulation and demodulation of a communication signal, or a baseband processing function. The second processor 12 may have, as a processing task, an application function to process communication data or to process games, moving images, entertainment, etc. the second processor 12 may be a multimedia coprocessor if necessary.

The flash memories 101 and 102 are nonvolatile memories, which have a NOR or NAND structure in a cell connection configuration of a memory cell array, and in which a memory cell is constructed of a MOS transistor having a floating gate. The nonvolatile memories 101 and 102 store data that should be retained even if power is turned off, for example, particular codes of handheld instruments and storage data. In this example, the flash memories are illustrated as NOR/NAND devices which have a NAND-type memory structure with a NOR-type interface such as Samsung's OneNAND® device, but the inventive principles are applicable to other types of nonvolatile memories.

The DRAM 17 having a dual port as shown in FIG. 5 may be used to store commands and data to be executed in the processors 10 and 12. Further, the DRAM 17 controls an interface function between the first and second processors 10 and 12. Though a more detailed description will follow below, a DRAM interface is used for communication between the processors 10 and 12, instead of an external interface. The processors 10 and 12 perform data communication through a shared memory area that is commonly accessible, by using an interface unit within a DRAM having a semaphore area and mailbox areas. When a host interface between processors is provided through the interior of a memory, a plurality of processors can access an allocated shared memory area at a high speed, thereby enhancing data transmission and processing speed within a compact sized system.

The system of FIG. 5 may be a portable computing device or portable communication device such as a mobile communication device, e.g., cellular phone, bi-directional radio communication system, single-directional pager, bi-directional pager, personal communication system or portable computer, etc. It can be understood by those skilled in the art that the scope and application of the invention is not limited thereto.

In the system of FIG. 5 the number of processors may be increased to mere three or more. The processor of the system may be a microprocessor, CPU, digital signal processor, micro controller, reduced command set computer, complex command set computer, etc. But it should be understood that the scope of the invention is not limited by the number of processors within the system. In addition, the scope of the invention is not limited to any specific combination of processors when the processors are the same or different from each other.

In the following description, the details of an interface unit and a shared memory area within the DRAM 17 of FIG. 5 and a data communication operation between processors will be provided only as an example for a thorough and complete understanding of the invention, with reference to the drawings partially illustrating the interior of a memory device.

Figure 6:
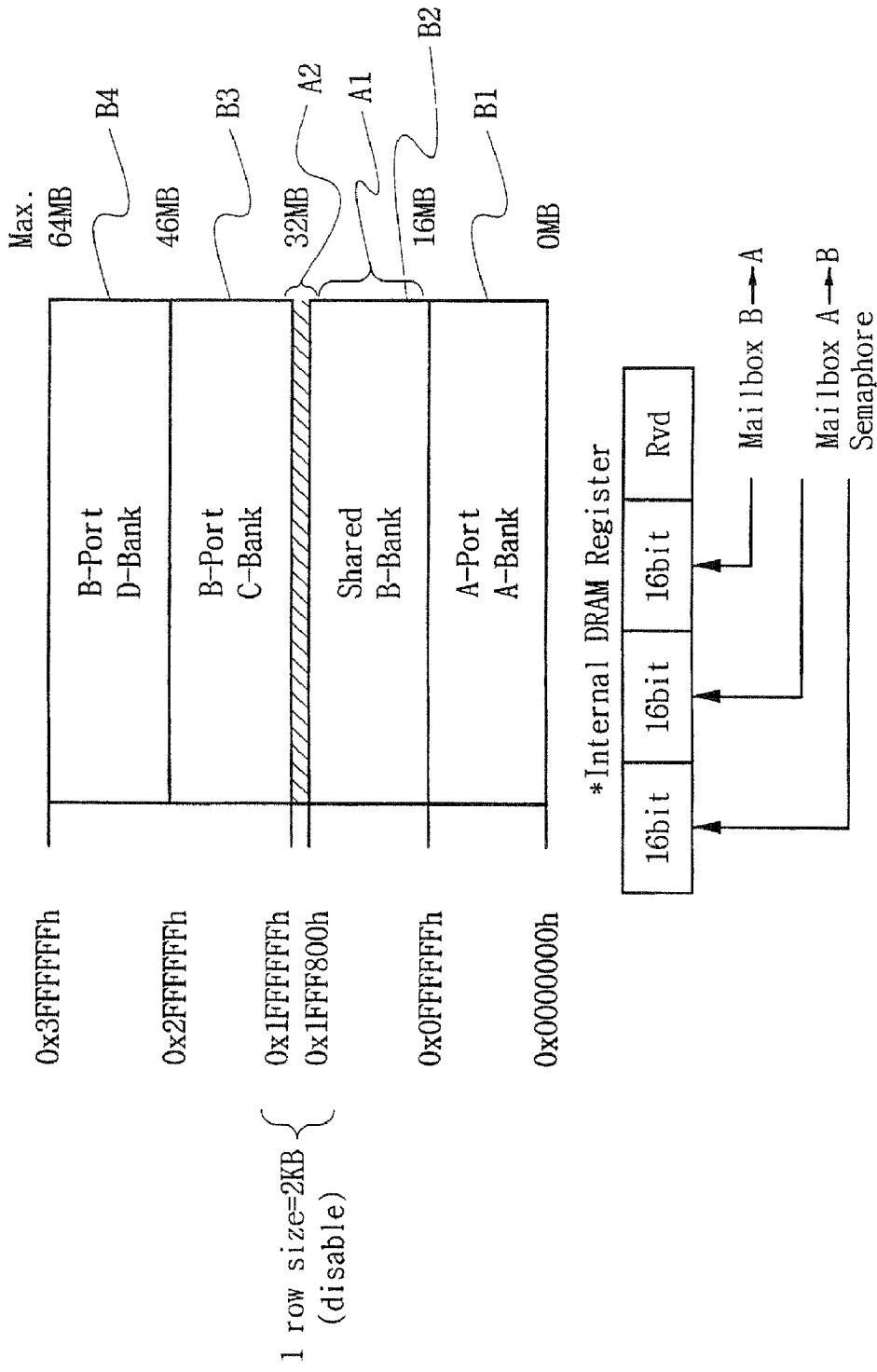
FIG. 6 is a block diagram illustrating a layout for memory areas of a multipath accessible DRAM having ports and an internal buffer according to some embodiments of the invention.

FIG. 6 is a block diagram illustrating memory areas of a multipath accessible DRAM such as that shown in FIG. 5, with ports and an internal buffer. With reference to the drawing, four memory areas B1-B4 are disposed within a memory cell array. An A bank memory area B1 is accessed by the first processor 10 through a first port A, and C and D bank memory areas B3 and B4 are accessed by the second processor 12 through a second port B. Also, a B bank memory area B2 is accessed by both of the first and second processors 10 and 12 through the first and second ports A, B. That is, the B bank memory area B2 is a shared memory area, and the A, C and D bank memory areas B1, B3 and B4 are private memory areas accessed only by each corresponding processor. Each of the four memory areas B1-B4 can be constructed in a unit of a bank in each DRAM, and one bank may have memory storage of, for example, 64 MB, 128 MB, 256 MB, 512 MB or 1024 MB.

In FIG. 6, an interface unit such as a register or buffer, etc. can be adapted within a DRAM to provide an interface between processors through the DRAM. The interface unit has a semaphore area and mailbox areas familiar with processing system developers. A specific row address (1FFF800h~1FFFFFFh, 2 KB size=1 row size) to enable one optional row of a shared memory area within the DRAM is variably allocated to an internal register as the interface unit. Thus, when an address (1FFF800h~1FFFFFFh) is applied, a corresponding specific word line of the shared memory area is disabled, while the interface unit is enabled. Consequently, the semaphore area and the mailbox areas of the interface unit are systematically accessed by using a direct address mapping method, and internally in the DRAM, a command to access a corresponding disabled address is decoded, being mapped to a register within the DRAM. Thus a memory controller of a chip set creates a command in the same method as a cell in other memory, thereby preventing a precharge error caused by a controller with an open policy.

In FIG. 6, in the internal register the semaphore area allocated 16 bits, a mailbox A to B area is allocated 16 bits, a mailbox B to A area is allocated 16 bits, and preliminary areas Rvd are commonly enabled by the specific row address, and are individually accessed/mapped according to an applied column address. That is, when the specific row address (1FFF800h~1FFFFFFh) is applied, a corresponding area portion A2 of a shared memory area is disabled, while a register within the DRAM is enabled and so a DRAM interface is provided to the processors.

Control authority for the shared memory area is indicated in the semaphore area allocated in the register, and a message such as an authority request, data transfer, command transmission, etc., given to a corresponding processor according to a predetermined transmission direction is written in the mailbox area. In particular, to transfer a message to the corresponding processor through a mailbox area, a mailbox write command is used. When the write command is generated, the DRAM creates an output signal (hereinafter, referred to as INTa, INTb) so as to cause a corresponding processor in a predetermined direction to execute an interrupt processing service, and the output signal is coupled to a GPIO of the corresponding processor or UART, etc. in hardware.

Figure 7:
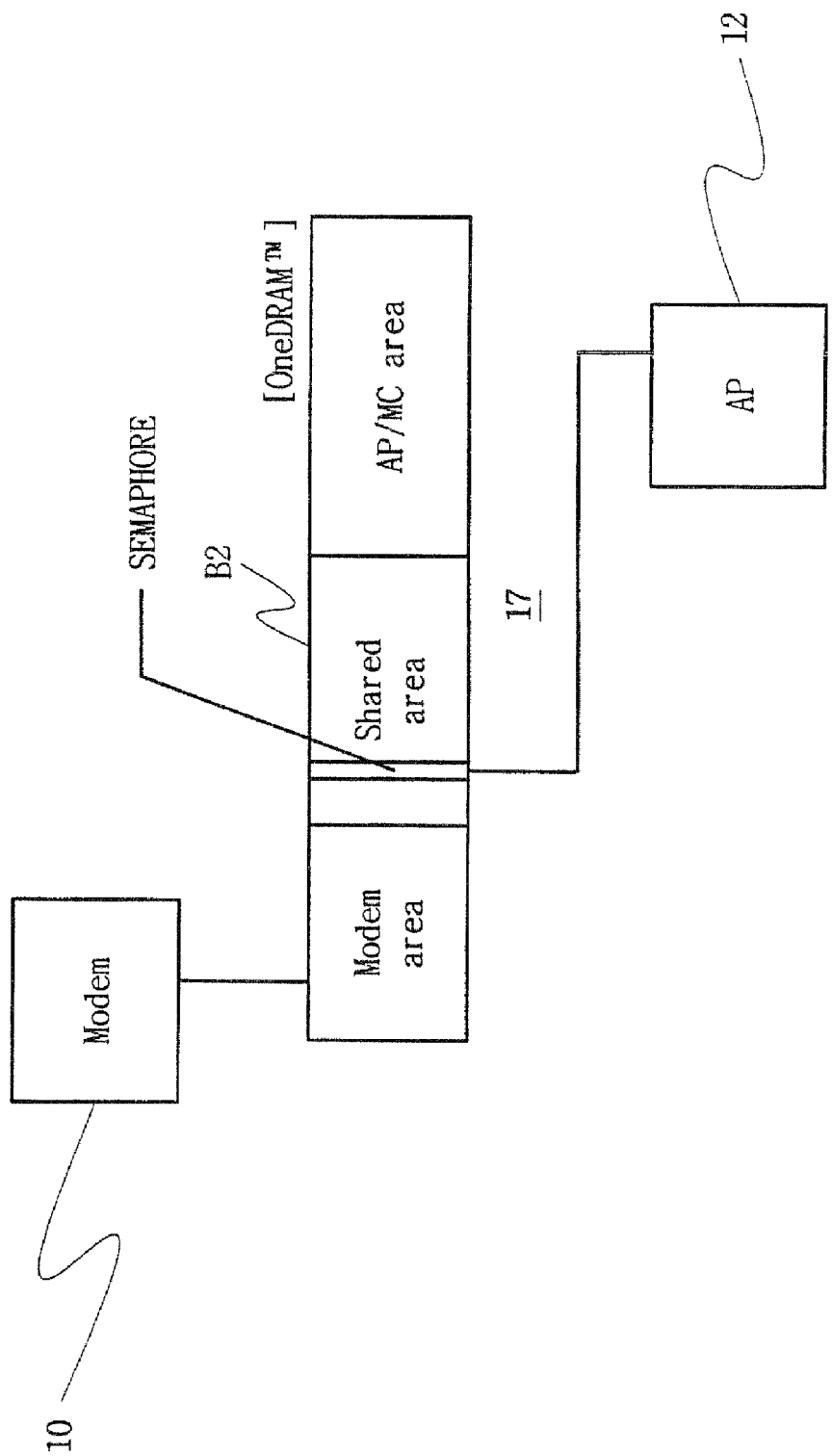
FIGS. 7 and 8 illustrate a method of gaining control authority of a shared memory area for a host interface according to some embodiments of the invention.
Figure 8:
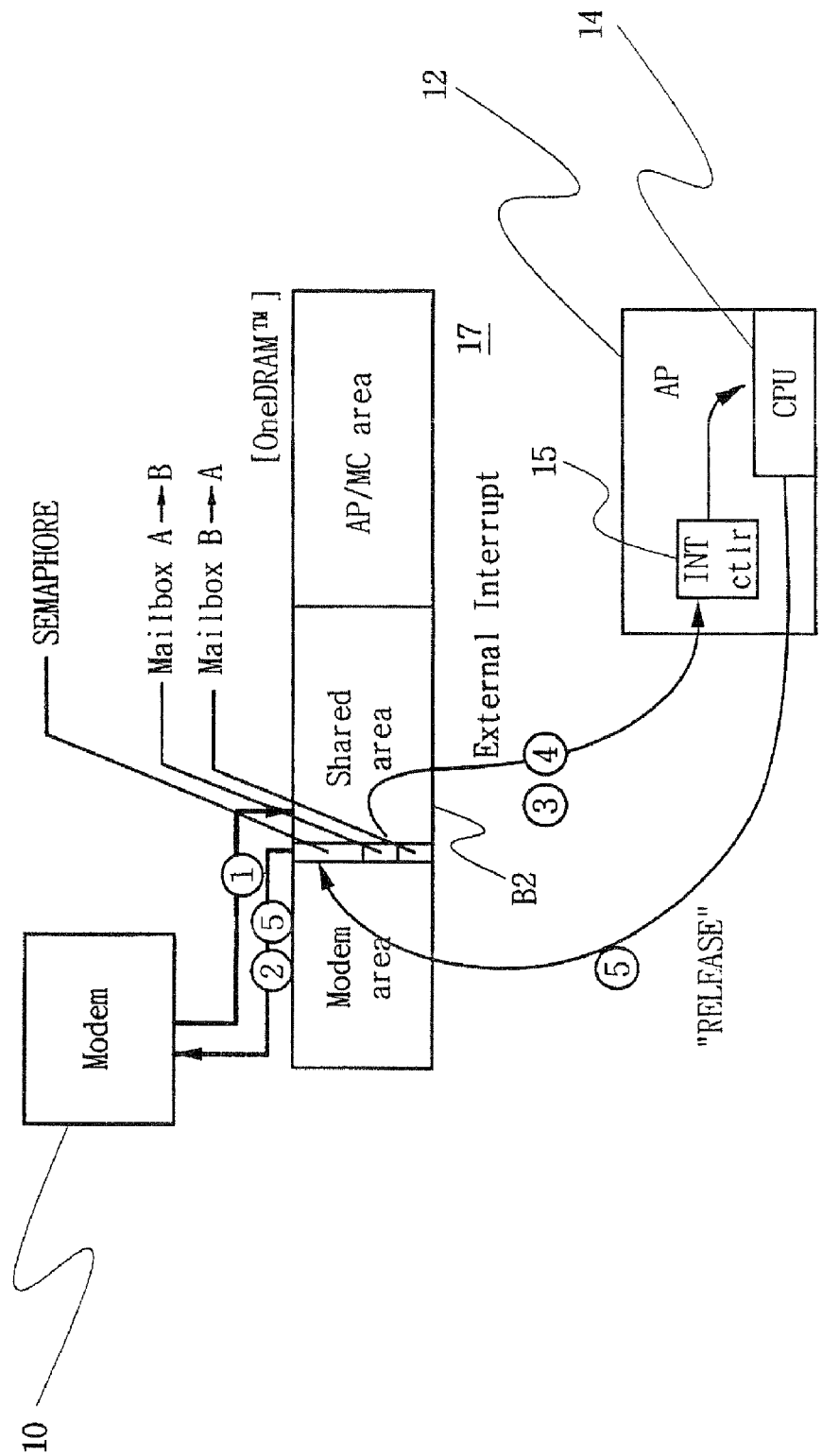

FIGS. 7 and 8 illustrate a method of gaining control authority of a shared memory area in performing a host interface in the DRAM shown in FIG. 5. FIGS. 7 and 8 provide examples to attain control authority by a processor by using a semaphore and a mailbox to enable use of a shared memory area as a shared resource for processors without a mutual collision. In a general reset operation of DRAM memory, auto refresh operations are performed twice and then an MRS (Mode Register Set) signal is set, but herein it is before completing a reset of memory, thus an auto refresh cannot be performed. To enable the auto refresh to be performed, control authority for the shared memory area B2 is allocated to one processor (hereinafter, referred to as "AP/MC") as a default. Then, when another processor (hereinafter, referred to as 'MODEM') not having the control authority requests to use the shared memory area B2, a mailbox message requesting authority is sent to the processor having the authority through a path represented by an arrow indicated by reference number ① in the drawing. MODEM 10 periodically monitors the semaphore area through a path represented by an arrow indicated by reference number ② to check for attainment of the control authority. At this time, the DRAM 17 clarifies a corresponding mailbox write command, then activates an output through a path represented by an arrow indicated by reference number ③ to generate an interrupt for AP/MC 12, and an interrupt controller 15 of the AP/MC 12 converts an activation signal into a deactivation signal when a corresponding mailbox read command is received through a path represented by an arrow indicated by reference number ④. Then, a CPU14 of the AP/MC 12 performs an interrupt service routine, and releases the semaphore through a path represented by an arrow indicated by reference number ⑤ when work it was originally working on is completed, so that processor 10 can use the semaphore. Thus the MODEM 10 which periodically monitors that operation, checks and confirms the release of the semaphore through the path ⑤, and ensures access authority to the shared memory area B2.

Figure 9:
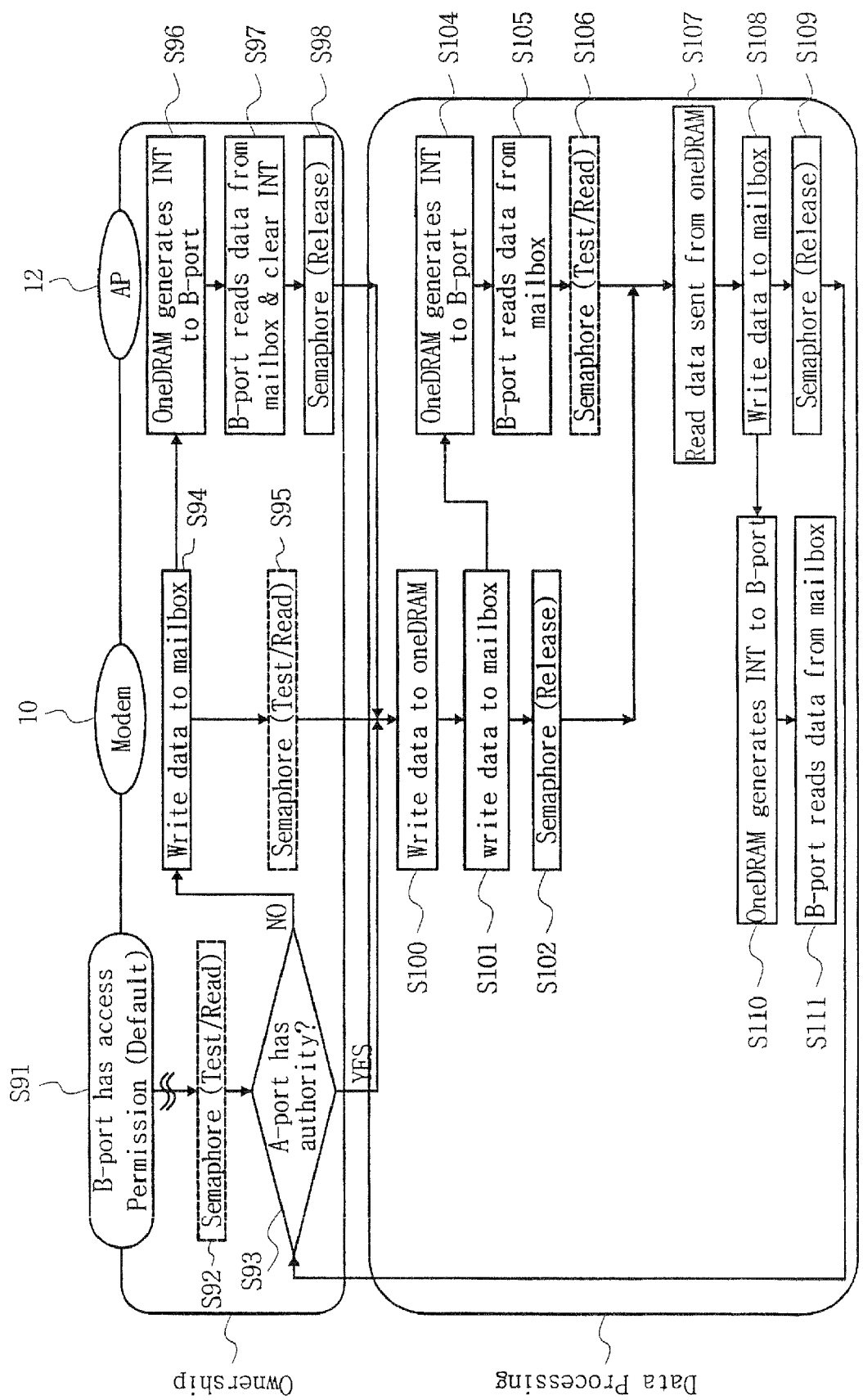
FIG. 9 is a flowchart illustrating methods of gaining control authority and data processing for a shared memory area for a host interface according to some embodiments of the invention.
Figure 10:
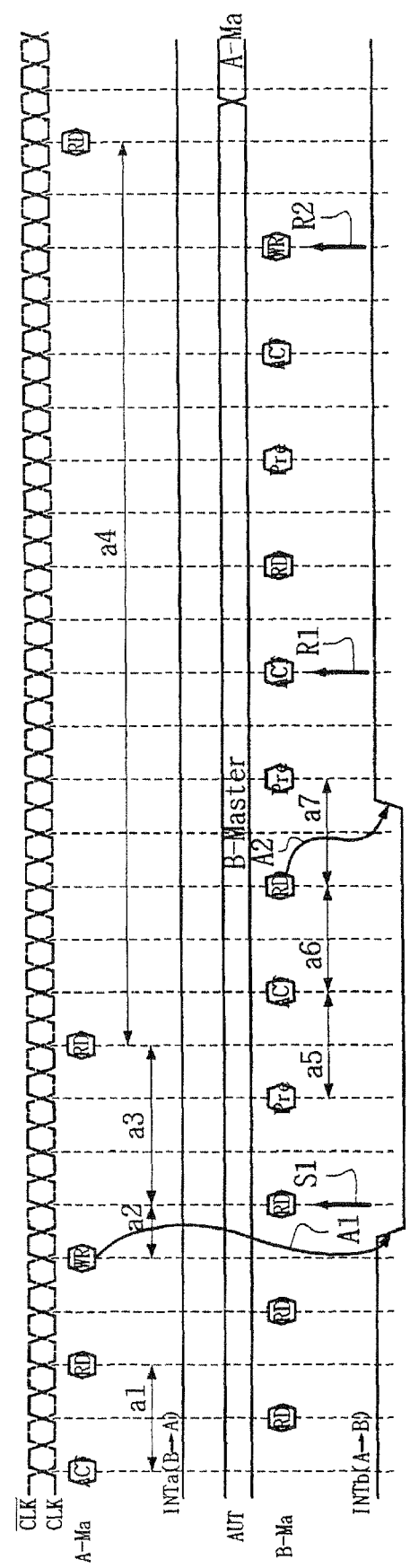
FIGS. 10 and 11 illustrate example timing for write/read operations of the DRAM shown in FIG. 6 relating to a host interface according to some embodiments of the invention.
Figure 11:
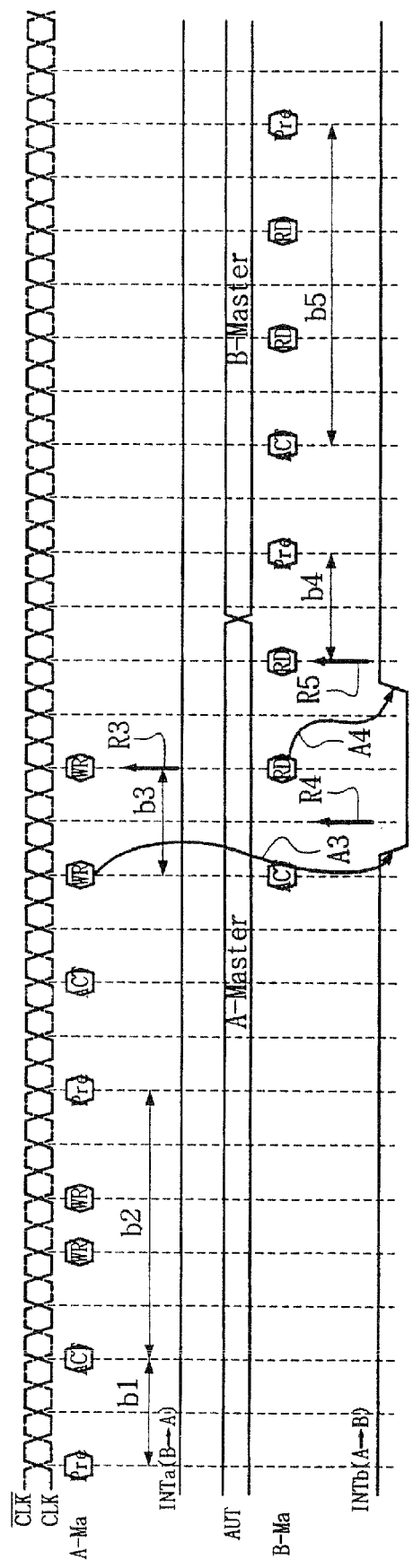

FIG. 9 is a flowchart illustrating data flow between the processors of FIG. 5 through the DRAM of FIG. 6. FIGS. 10 and 11 illustrate the timing of write/read operations of the DRAM shown in FIG. 6, relating to a host interface function.

FIGS. 9 to 11 illustrate an exemplary embodiment of a method in which the second processor initially has access authority to the shared memory area B2, and then the first processor MODEM 10 gains access authority and transmits data to the second processor AP 12. The timing diagrams of FIGS. 10 and 11 illustrate in detail an example in which the semaphore and mailboxes arranged in internal register 50 of FIG. 12 are utilized when the MODEM 10 writes data to the shared memory bank A1 shown in FIG. 12 and the AP 12 reads the data therefrom.

Before describing the data transmission through an internal interface of a DRAM, a multipath access operation of a multipath accessible DRAM will be described as follows, with reference to FIG. 12 which is a block diagram illustrating in detail the circuit of FIG. 6.

Figure 12:
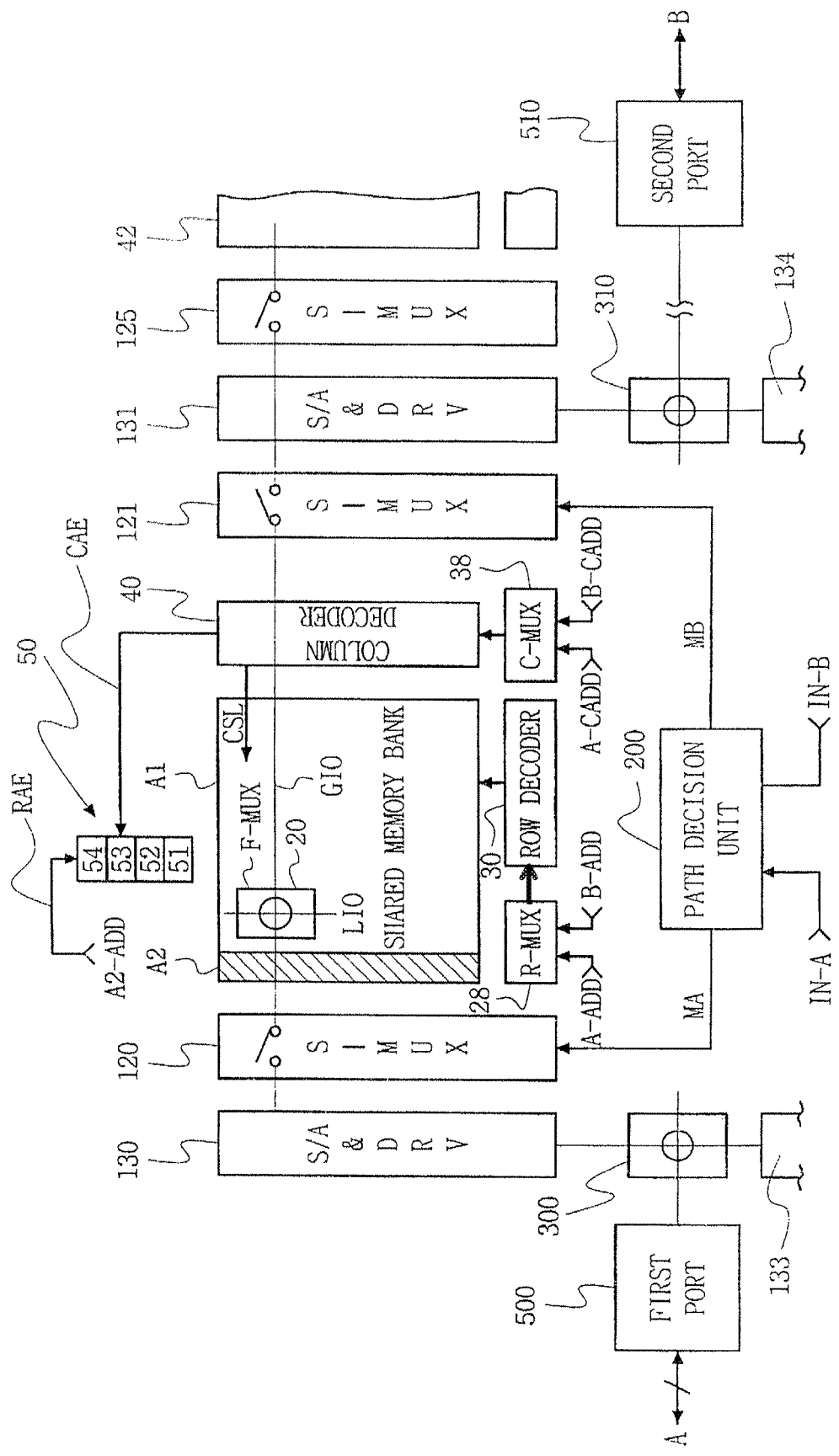
FIG. 12 is a block diagram illustrating some example implementation details for circuit of FIG. 6 according to some embodiments of the invention.

In FIG. 12, for example, when the first processor 10 accesses the shared memory bank A1 through a first port 500, the second processor 12 can access other memory areas through a second port 510, simultaneously. Such multipath access operation can be realized through an access path forming unit in which a path decision unit 200 of FIG. 12 is basically adapted.

In an example for shared memory bank A1 which is accessible by both the first and second processors 10 and 12, a global input/output line GIO within the shared memory area A1 can be selectively coupled to one of the first and second ports 500 and 510 that are each correspondingly connected to the first and second processors. This selective connection can be realized through a control operation of the path decision unit 200.

The path decision unit 200 of the access path forming unit generates a path decision signal MA, MB to form a data access path between one of the ports A and B and the shared memory area A1, in response to external signals IN-A and IN-B applied from the first and second processors 10 and 12. The external signals may contain a row address strobe signal RASB, a write enable signal WEB and a bank selection address BA each applied through the first and second ports 500 and 510.

The access path forming unit includes row and column address multiplexers 28, 38, first and second global multiplexers 120 and 121, and an input/output related path unit.

The row and column address multiplexers 28, 38 select one row and column address A_ADD, A_CADD from row and column addresses A_ADD, B_ADD, A_CADD, B_CADD each applied through the first and second ports 500, 510 in response to the path decision signal MA, MB, and each applies the address to a row decoder 30 and a column decoder 40 coupled to the shared memory area A1.

The first and second global multiplexers 120 and 121 connect a global input/output line GIO of the shared memory area A1 to a first or second port in response to the path decision signal MA, MB.

The input/output related path unit includes a first input/output related circuit 130, 300 coupled between the first global multiplexer 120 and the first port 500, and a second input/output related circuit 131, 310 coupled between the second global multiplexer 121 and the second port 510.

The first input/output related circuit may include an input/output sense amplifier operationally connected to the first global multiplexer 120, and a data input/output driver.

A plurality of memory cells disposed in a matrix of rows and columns in the shared memory area A1 may be DRAM memory cells in which each cell includes one access transistor and a storage capacitor.

For one shared memory area A1 shown in FIG. 12, two input/output sense amplifier and write drivers 130 and 131 are disposed, and the first and second global multiplexers 120 and 121 have a mutually complementary switching operation.

First and second processors 10 and 12 share circuit devices and lines provided between a global input/output line GIO and a memory cell to perform an access operation, and independently use input/output related circuit devices and lines from each port to the global multiplexer 120, 121.

The first and second processors 10 and 12 share the global input/output line GIO of the shared memory area A1, a local input/output line LIO operationally coupled to the global input/output line, a bit line BL operationally connected to the local input/output line by a column selection signal CSL, a bit line sense amplifier coupled on the bit line, for sensing and amplifying data of the bit line, and a memory cell connected to an access transistor AT forming a memory cell on the bit line, through the first and second ports.

The path decision unit 200 is constructed of a plurality of logic gates, and receives a row address strobe signal RASB_A,B, a write enable signal WEB_A,B and a bank selection address BA_A,B each applied through the first, second port 500, 510. When a row address strobe signal RASB is first applied through one of the ports, the path decision unit 200 generates path decision signal MA, MB so as to enable the shared memory area A1 to be accessed by the one port through which the signal entered. If row address strobe signals RASB are applied simultaneously, it may be desirable for a processor having priority to access the shared memory area A1 until a cutoff occurs in accordance with a specification of the system.

If the first processor 10 accesses the shared memory area A1 as a shared bank and the operating mode is a read operation, the path decision unit 200 of FIG. 12 logically combines external signals applied from the first processor 10, and activates the path decision signal MA, and deactivates the path decision signal MB. The row address multiplexer 28 selects a row address A_ADD applied through the first port A, and applies it to the row decoder 30. The row decoder 30 activates a word line WLi within the shared memory area A1 to be accessed by the first processor 10. When the word line WLi is activated, data of memory cells in which gates of access transistors are connected to the same word line are developed to a corresponding bit line. The bit line sense amplifier senses and amplifies the developing data and then outputs the data. The bit line data is transferred to a corresponding local input/output line LIO when a column gate responding to an activated column selection signal CSL is turned on. The turn-on operation of the column gate is as follows. The word line WLi is activated so data of the memory cell appears as high or low level potentials on the bit line, then the column address multiplexer 38 selects column address A_CADD of first port A and outputs it to the column decoder 40. The column decoder 40 activates a column selection signal that selects a column to be accessed by the first processor 10.

Data of the local input/output line LIO appearing as a potential level is transferred to a global input/output line GIO when transistors constituting a first multiplexer F-MUX 20 are turned on. A switching signal commonly applied to gates of the transistors may herein be a signal generated in response to a decoded signal output from the row decoder 30. In this case a path decision signal MA is output in an activated state, thus the data transferred to the global input/output line GIO is transferred to the input/output sense amplifier and write driver 130 through the second multiplexer 120. The input/output sense amplifier again amplifies the data levels which may have become weakened during the course of the transfer operations through these paths, and transfers it to first port 500 through the multiplexer and driver 300.

On the other hand, in this case the second multiplexer 121 is disabled and an access operation of the second processor 12 for the shared memory area A1 is cut off. But, the second processor 12 can access memory areas other than the shared memory area A1 through the second port 510. Herein a determination of the size or the number of the memory areas may be varied depending upon an operating load of the first and second processors.

An input/output sense amplifier and write driver 133 is a component constituting an input/output related circuit which is disposed between the first port 500 and a memory bank other than the shared memory bank, and has the same structure as the input/output sense amplifier and write driver 300. Similarly, an input/output sense amplifier and write driver 134 is a component constituting an input/output related circuit which is disposed between the second port 510 and a memory bank other than the shared memory bank, and has the same structure as the input/output sense amplifier and write driver 130. Further, a column decoder 42 is connected to a memory bank other than the shared memory bank.

Referring back to FIGS. 9 to 11, an example in which the MODEM 10 writes data to the shared memory bank A1 and the AP 12 reads data will be described as follows.

Referring first to S91 of FIG. 9, the B port has the access permission as a default. Thus a signal AUT of FIG. 10 indicating the authority is shown as "B-master". At this time, even though the MODEM 10 periodically reads the semaphore area 51 of the internal register 50 shown in FIG. 12, AP 12 still has the authority. At this time, when the MODEM 10 connected to the A port requests access permission, data requesting the authority is written to the A to B mailbox 52, as shown in step S94 of FIG. 9. That is, step S94 is performed after it is determined that the B port has the authority by the checking the access permission in step S93. According to the access request result, an output signal INTb of DRAM 17 is applied as a low level to the AP 12 as shown by an arrow A1 of FIG. 10, in step S96. Then an interrupt controller 15 of the AP 12 recognizes there is the access request from the processor 10. The AP 12 first stops an access operation of the shared memory area A1 at a time point S1 of FIG. 10, and performs a precharge to prevent disappearance of data stored in memory cells of the shared memory area A1. In step S97, the AP 12 reads the A to B mailbox 52 to which the MODEM 10 wrote data, and clears the output signal INTb of the DRAM 17 as a high level state. Thus the level of waveform INTb is restored to a high level as shown by an arrow A2 of FIG. 10. During a period of time from R1 to R2 of FIG. 10, the AP 12 again restores precharge and access authority for the shared memory area A1, and then after the time point R2, writes data indicating 'B master release' to semaphore area 51. In this case, for example, data represented as "1" in the semaphore area 51 is changed to "0" so the MODEM 10 can recognize that the AP 12 delegates the access authority. An internal register or buffer including the semaphore area 51 has a storage cell such as a flip flop or latch and so does not need a precharge operation. Step S98 of FIG. 9 is completed immediately after the time point R2 lapses. At a time period a4 of FIG. 10, the MODEM 10 periodically checking the semaphore area 51 reads the semaphore area 51 after the time point R2, and then recognizes the access permission belongs to the MODEM itself. The timing parameters of FIGS. 10 and 11 are examples of a DRAM having a burst length 4, a CAS latency 3 and a WL 1, wherein the WL, indicates a time period a2 corresponding to one clock cycle shown in FIG. 10. Time periods a1, a3, a4, a5, a6 and a7 in FIG. 10 indicate tRCD, BL/2+tWR, access permission gain period, tRP, tRCD and CL+BL/2. The time period a4 corresponds to the time taken in performing step S95 by the MODEM 10 of FIG. 9. Thus, the MODEM 10 as the first processor to obtain access permission from the AP 12, which has access permission by default, was described above according to an embodiment of the invention, with the respective steps for the ownership of FIG. 9 and the timing parameters of FIG. 10.

In the following description with the respective steps included in the data processing of FIG. 9 and FIG. 11, the MODEM 10 obtains the access permission and writes data, and then the written data is transmitted to the AP 12.

That is, the MODEM 10 that obtained the access permission through step S98 of FIG. 9, performs in order, steps S100, S101 and S102 of FIG. 9. The steps S100, S101 and S102 are performed in order by writing data to a shared memory area of DRAM, writing message data to a mailbox for a corresponding processor, and releasing the semaphore area 51. In FIG. 11, a signal AUT indicating the authority is shown as "A-master" in the first-half of an overall time period, and as "B-master in the second-half of the overall time period. The MODEM 10 writes transmission data to the shared memory area A1 within the time period b2 after the time period b1 indicating tRP. The write operation is performed by the above-mentioned multipath access operation. After completion of the write operation, the MODEM 10 writes message data to the B to A mailbox 53, before the beginning of time period b3. The message data may indicate, for example, a request that AP 12 read the transmission data that MODEM 10 wrote, if AP 12 has time. Then the MODEM 10 changes permission authority data of the semaphore area 51 at a time point R3 indicating a finishing time of the time period b3.

The AP 12 receives an interrupt output signal INTb of DRAM 17 shown in FIG. 11 as a low level when the MODEM 10 writes a message to the B to A mailbox 53. Thus, the AP 12 responds to the interrupt output signal at a time point R4 in step S104. The AP 12 reads the B to A mailbox 53 in step S105, and clears the output signal INTb of the DRAM 17 as a high level state. Thus the level of waveform INTb is restored to a high level as shown by an arrow A4 of FIG. 11. The AP 12 reads the semaphore area 51 in step S106. At time point R5 of FIG. 11, the AP 12 again regains the precharge and access authority for the shared memory area A1. The AP 12 reads data from MODEM written to the shared memory area A1 in step S107. Step S107 is performed within a time period b5 of FIG. 11. The read operation of the data stored in the shared memory area is performed by the afore-mentioned multipath access operation through the B port.

After the data transmission, the AP 12 writes message data to a mailbox in step S108, and the AP 12 releases the semaphore in order to release the access authority in step S109. In response to step S108, the MODEM 10 receives the interrupt output signal transmitted from the DRAM in step S110, and reads message data from the mailbox in step S111.

As described above, an interface operation is performed through an internal register of the DRAM, and data written by one processor is read by another corresponding processor.

Some advantages in transmitting data or commands through the mailbox are as follows. Access to a shared memory area is permitted only by a processor that gained the control authority for the shared memory area, but a mailbox area can be accessed at any time by both processors regardless of the control authority. That is, both processors allocate specific bits and so can transmit data or commands to a corresponding processor. Data corresponding to the size of the mailbox can be received and stored without wasting time to request the control authority by transmitting data or commands through the mailbox.

Figure 13:
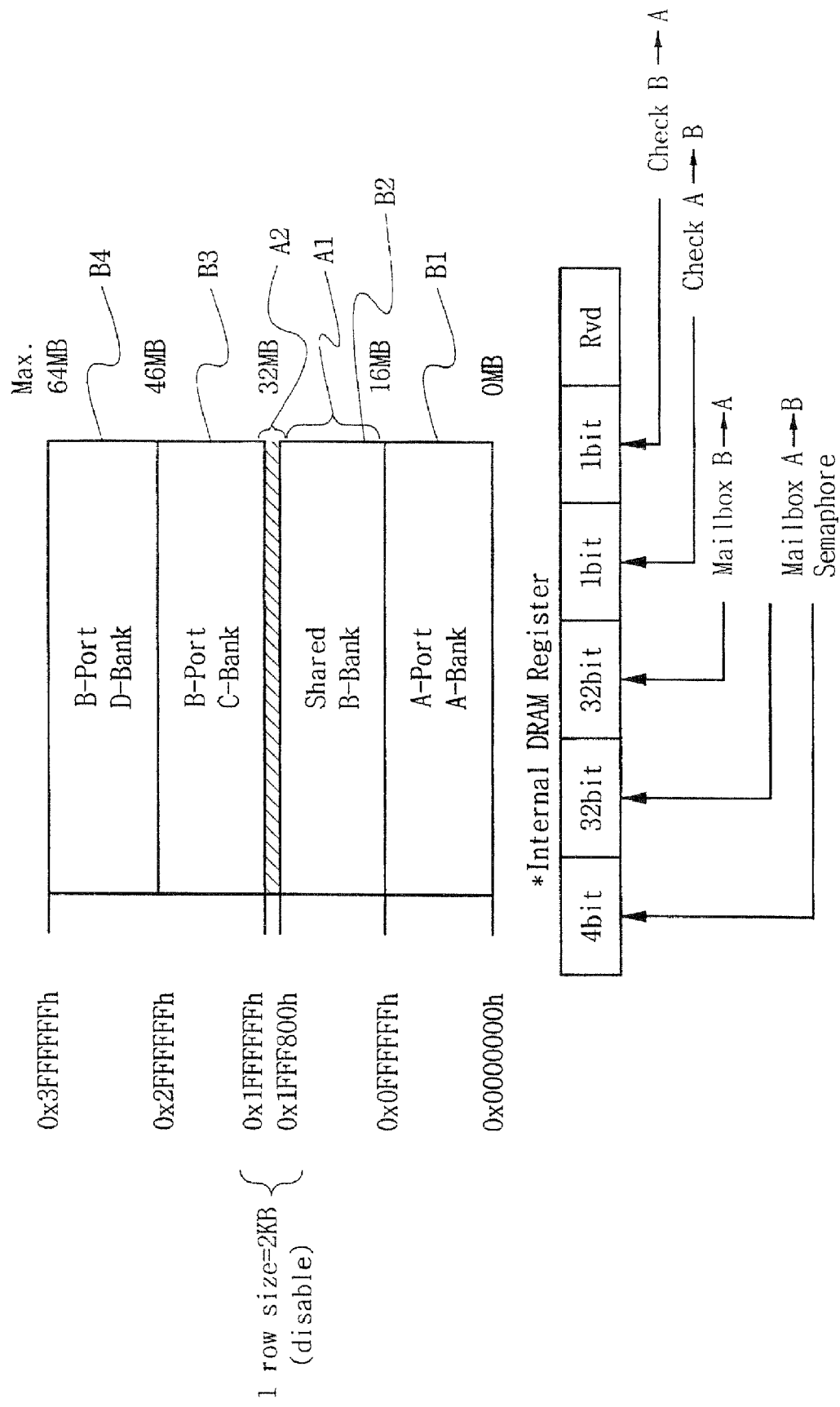
FIG. 13 is a block diagram illustrating memory areas of a DRAM such as that shown in FIG. 5 with ports and an internal buffer, according to another embodiment of the invention.

FIG. 13 is a block diagram illustrating another embodiment of memory areas in a multipath accessible DRAM having ports and an internal buffer such as that shown in FIG. 5.

As shown in FIG. 13, the embodiment further comprises check areas in the interface area which is different from that of FIG. 6. The check areas store check information indicating if a message has been read by another processor when the message for the other processor is stored in the mail box area.

In FIG. 13, a semaphore area is allocated 4 bits in the internal register, a mail box A to B area is allocated in 32 bits, a mail box B to A area is allocated in 32 bits, a check A to B area is allocated 1 bit, a check B to A area is allocated 1 bit, and a preliminary area Rvd is reserved for other possible uses. These areas are commonly enabled by the specific row address, and are individually accessed/mapped according to an applied column address. Here, the check A to B area and the check B to A area may each be allocated 2 bits, where 1 bit may store information, and the other 1 bit may be used as a preliminary area. As another example, the semaphore area, the mail box A to B area, and the mail box B to A area may each be allocated 16 bits as shown in FIG. 6.

Thus, when the specific row address 1FFF800h~1FFFFFFh is applied, a corresponding area portion A2 of a shared memory area is disabled, while a register within the DRAM is enabled so a DRAM interface is provided to the processors. The first processor 10 is able to read and write in the mail box A to B area, while the second processor 12 is only able to read and not able to write in the mail box A to B area. In contrast, the second processor 12 is able to read and write in the mail box B to A area, while the first processor 10 is only able to read and not able to write in the mail box B to A area.

Control authority for the shared memory area is indicated in the semaphore area allocated in the register, and a message such as an authority request, data transfer, command transmission, etc., given to a corresponding processor according to a predetermined transmission direction is written in the mailbox area. In particular, to transfer a message to the corresponding processor through a mailbox area, a mailbox write command is used. When the write command is generated, the DRAM creates an output signal (INTa, INTb) so as to cause a corresponding processor in a predetermined direction to execute an interrupt processing service, and the output signal is coupled to a GPIO of the corresponding processor or UART, etc. in hardware.

A method of transmitting a message by using the above mail box areas in the multipath accessible semiconductor memory device will be described below along with an interface operation of the check areas and a separate pin for the checking operation. A read operation or a write operation for the shared memory area and the semaphore area has been already described in FIGS. 6-12.

Figure 14:
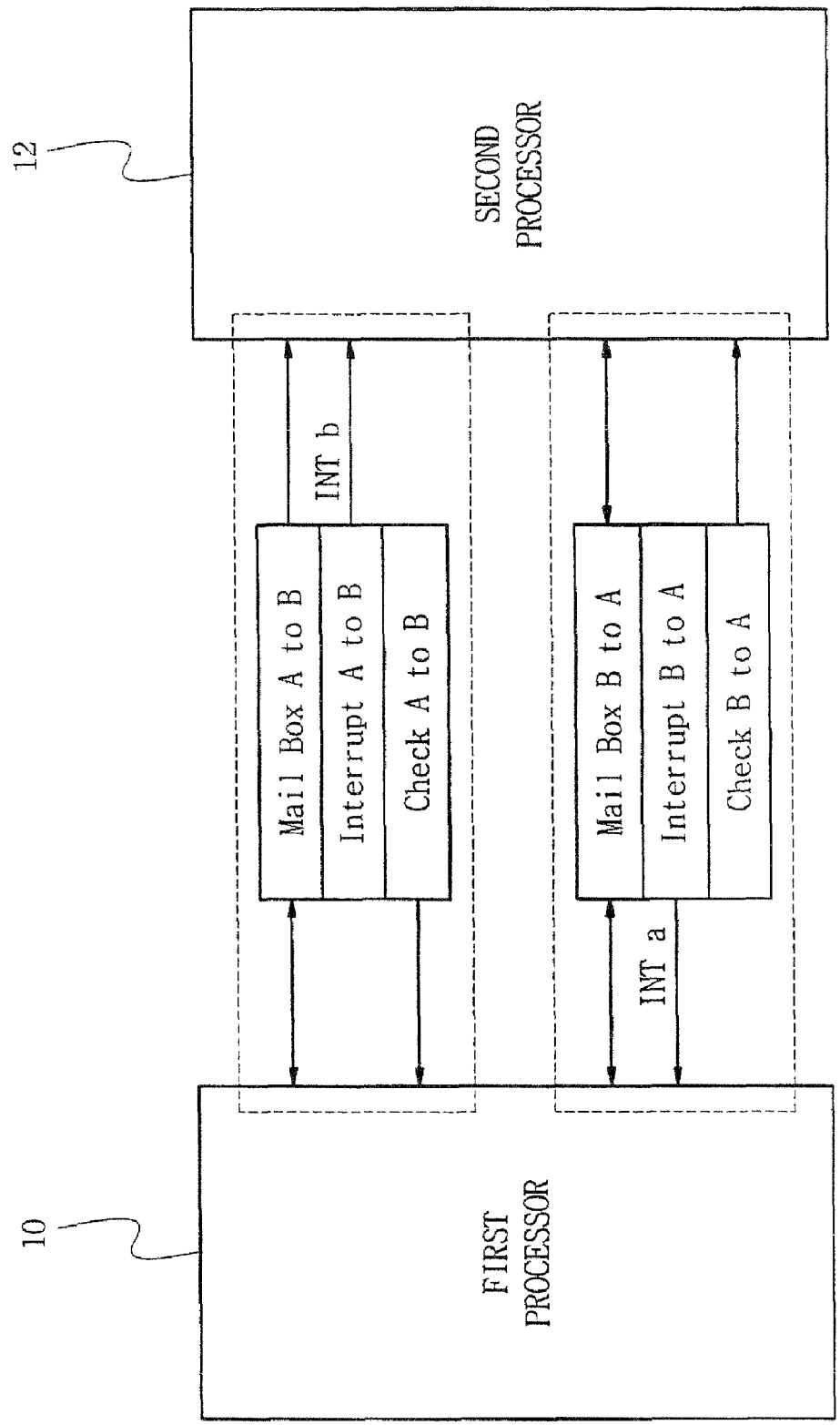
FIG. 14 is a block diagram illustrating an interface operation of the check area and the mail box area between the processors in FIG. 5 having the DRAM structure as shown in FIG. 13.

FIG. 14 illustrates an interface operation of the check area and the mail box area between the processors in the system having the DRAM structure as shown in FIG. 13.

As shown in FIG. 14, when the first processor 10 desires to send a message such as an authority request, data transfer, command transmission, etc., the first processor writes the message in the mail box A to B area. Here, the DRAM 17 enables/generates an interrupt signal INTb so as to inform the second processor 12 that the message has been written in the mail box A to B area. The interrupt signal INTb is enabled when a message is written in the mail box A to B area, and disabled when the second processor 12 reads the message stored in the mail box A to B area.

Next, the first processor 10 monitors the check A to B area to check if the second processor 12 has read the message stored in the mail box A to B area. The check register in the check A to B area stores information indicating if the second processor 12 has read the message. The check register may store information having the same phase as the interrupt signal INTb or the opposite phase as the signal. For example, an operation in a case in which the signals have the same phase is as follows. When the interrupt signal INTb is enabled as a low level, the second processor 12 has not read the message stored in the mail box A to B area. Thus, a low level "data 0" is stored in the check A to B area. Later, when the interrupt signal INTb is disabled as a high level, the second processor 12 has read the message stored in the mail box A to B area. Thus, a high level "data 1" is stored in the check A to B area. The first processor 10 stores a message in the mail box A to B area, and then occasionally monitors the check A to B area so as to check if the second processor 12 has read the message stored in the mail box A to B area.

When it is determined that the second processor 12 has read the message stored in the mailbox A to B area, another message may be written in the mailbox A to B area. Providing the above check A to B area prevents messages from being overwritten in the mail box A to B area.

Next, an operation will be described in which the second processor 12 desires to send a message such as an authority request, data transfer, command transmission, etc. to the first processor 10. In this case, the second processor 12 writes the message in the mail box B to A area. Here, the DRAM 17 enables/generates an interrupt signal INTa so as to inform the first processor 10 that the message has been written in the mail box B to A area. The interrupt signal INTa is enabled when a message is written in the mail box B to A area, and disabled when the first processor 10 reads the message stored in the mail box B to A area.

Next, the second processor 12 monitors the check B to A area to check if the first processor 10 has read the message stored in the mail box B to A. The check register in the check B to A area stores information indicating if the first processor 10 has read the message. The check register may store information having the same phase as the interrupt signal INTa or the opposite phase as the signal.

For example, an operation in which the signals have the same phase is as follows. When the interrupt signal INTa is enabled as a low level, the first processor 10 has not read the message stored in the mail box B to A area. Thus, a low level "data 0" is stored in the check B to A area. Later, when the interrupt signal INTa is disabled as a high level, the first processor 10 has read the message stored in the mail box B to A area. Thus, a high level "data 1" is stored in the check B to A area. The second processor 12 stores a message in the mail box B to A area, and then occasionally monitors the check B to A area so as to check if the first processor 10 has read the message stored in the mail box B to A area.

When it is determined that the first processor 10 has read the message stored in the mailbox B to A area, another message may be written in the mailbox B to A area. Providing the above check area B to A area prevents messages from being overwritten in the mail box B to A area.

Although FIG. 14 illustrates two processors, a structure having other numbers of processors may be embodied by one of ordinary skill in the art. In this case, the check B to A area and check A to B area may be monitored by other processors excluding the processor which has read the message.

Figure 15:
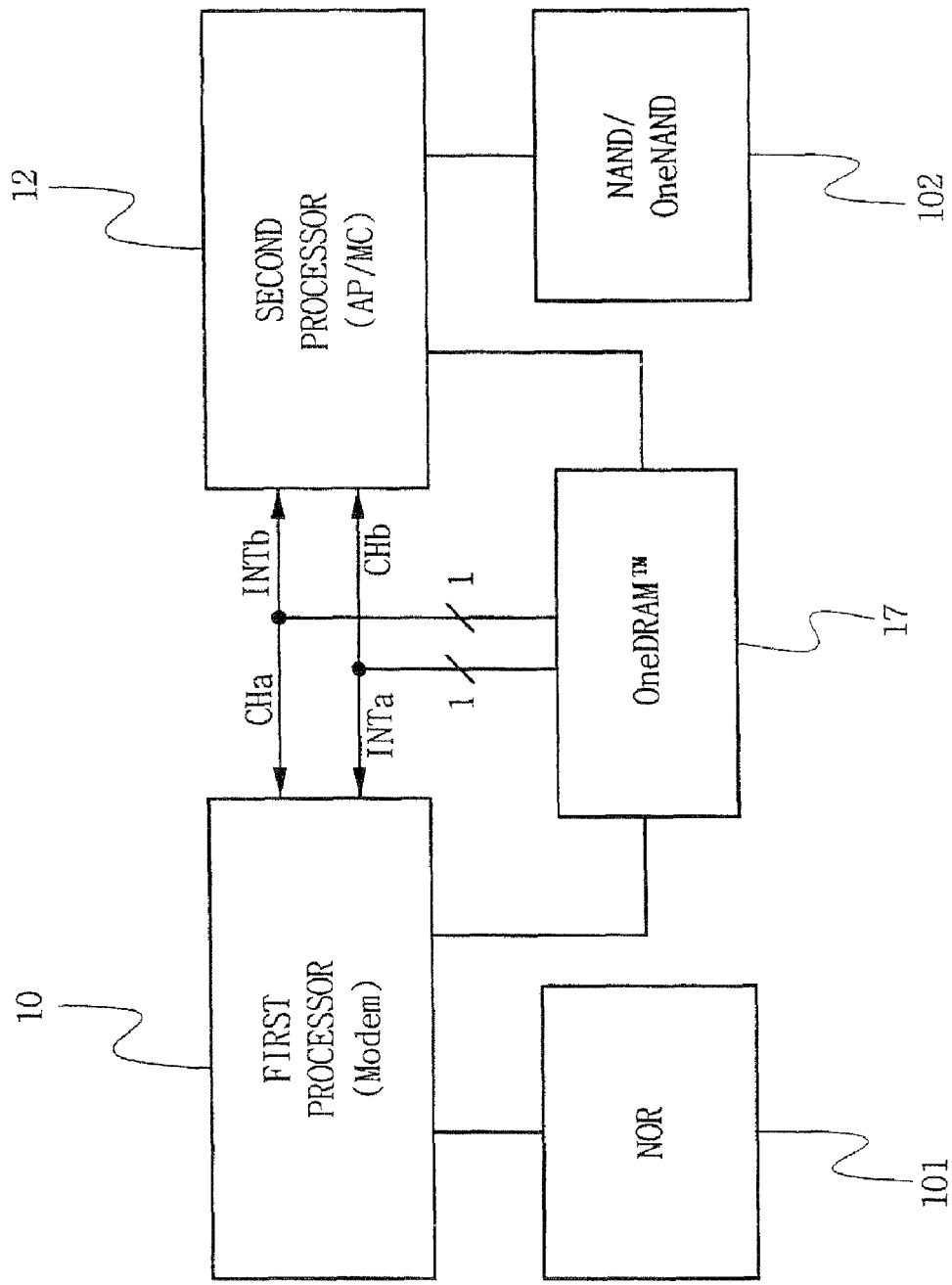
FIG. 15 is a block diagram illustrating a multi processor system having a multipath accessible DRAM according to another embodiment of the present invention.
Figure 16:
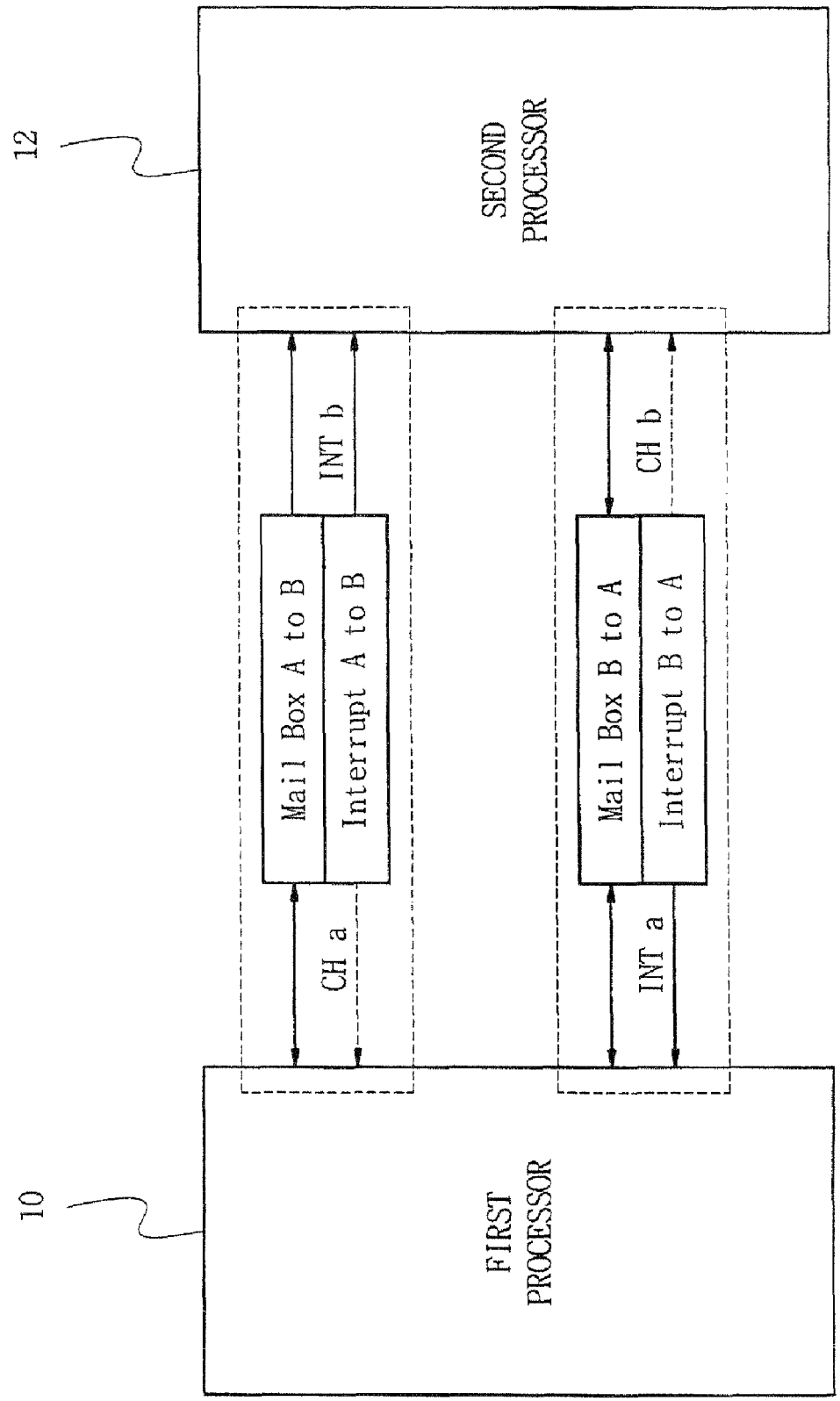
FIG. 16 is a block diagram illustrating an interface operation communicating check information for the mail boxes between the processors in FIG. 15.

FIGS. 15 and 16 illustrate a structure further comprising separate output pins without having the check area described in FIGS. 13 and 14, according to another embodiment of the present invention.

FIG. 15 is similar to FIG. 5 and so only parts having different construction will be described in the following. As shown in FIG. 15, the DRAM 17 has two independent ports. Port A having an output signal INTa, CHb is herein called a first port, and the first port is connected to the first processor 10 and the second processor 12. Here, the signal INTa input to the first processor 10 functions as an interrupt signal, and the signal CHb input to the second processor 12 is a check signal indicating if the first processor 10 has read a message stored in the mail box B to A area.

Port B having an output signal INTb, CHa is herein called a second port, and the second port is connected to the first processor 10 and the second processor 12. Here, the signal INTb input to the second processor 12 functions as an interrupt signal, and the signal CHa input to the first processor 10 is a check signal informing if the second processor 12 has read a message stored in the mail box A to B area.

In FIG. 15, the interrupt signal indicates whether the message stored in the mail box area of the corresponding processor has been read. The structure in FIG. 15 uses the characteristic that the interrupt signal is enabled when the processor writes a message in the mail box, and the interrupt signal is disabled when the corresponding processor has read the message stored in the mail box. In this case, the check signals have the same phase as the interrupt signals. The check signals are disabled when the interrupt signals are enabled, and enabled when the interrupt signals are disabled.

An operation of this structure will be described as follows with respect to FIG. 16. First, when the first processor 10 desires to send a message such as an authority request to the second processor 12, the first processor writes the message in the mail box A to B area. Here, the DRAM 17 enables/generates an interrupt signal INTb at a low level so as to inform the second processor 12 that the message has been written in the mail box A to B area. In this case, the check signal CHa is maintained disabled in the same phase as the interrupt signal INTb.

Then, the interrupt signal INTb is disabled in a high level when the second processor 12 reads the message stored in the mail box A to B area. At the same time, the check signal Cha is enabled at a high level to inform the first processor 10 that the stored message has been read. When the check signal CHa indicates that the second processor 12 has read the message stored in the mailbox A to B area, the first processor 10 may write another message in the mailbox A to B area.

Next, when the second processor 12 desires to send a message such as an authority request to the first processor 10, the second processor writes the message in the mail box B to A area. Here, the DRAM 17 enables/generates an interrupt signal INTa at a low level so as to inform the first processor 10 that the message has been written in the mail box B to A area. In this case, the check signal CHb is maintained disabled in the same phase as the interrupt signal INTa.

Then, the interrupt signal INTa is disabled at a high level when the first processor 10 reads the message stored in the mail box B to A area. At the same time, the check signal CHb is enabled at a high level to inform the second processor 12 that the stored message has been read. When the check signal CHb indicates that the first processor 10 has read the message stored in the mailbox B to A area, the second processor 12 may write another message in the mailbox B to A area.

Figure 17:
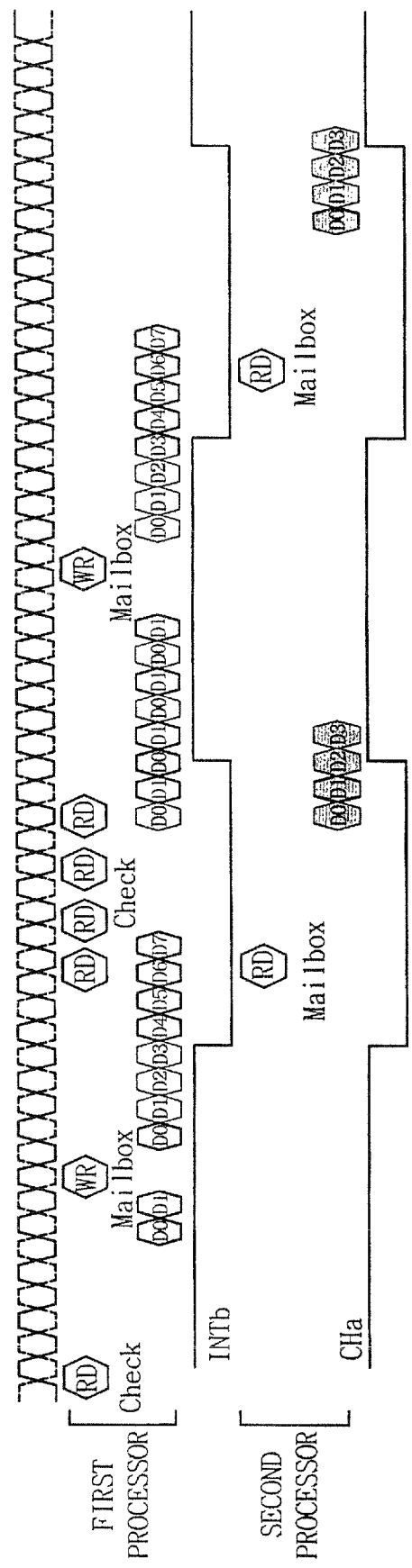
FIG. 17 is a timing diagram illustrating example operations of the apparatus of FIG. 14 and FIG. 16.

FIG. 17 is a timing diagram illustrating example embodiments of operations that may apply to either FIG. 14 or FIG. 16. Although the operations will be illustrated with reference to FIG. 14 and FIG. 16 for convenience, the embodiments have different structures, and other operations may thus be different. For example, the embodiment of FIG. 14 has a check register which is different from that of FIG. 16 which uses interrupt signals. In addition, FIG. 17 illustrates an example when the first processor 10 stores a message in the mail box and the second processor 12 reads the message.

As shown in FIG. 17, the first processor 10 checks if a message can be stored in the mail box through the check register in the check area or the check signal. In this case, the check register stores data [1] or the check signal is enabled at a high level, and the first processor 10 writes a message in the mail box. In other words, the message of Do to D3 is stored and then the first processor 10 continuously monitors the check area or the check signal after writing the message in the mail box. Alternatively, the first processor may monitor only when it desires to send another message. When the first processor 10 stores the message in the mail box, the DRAM causes the interrupt signal INTb to be enabled in a low level and sends the signal to the second processor 12. In addition, the check register stores data [0], or the check signal is changed to a disabled state.

Accordingly, the second processor 12 reads the message stored in the mail box. The check information is in the disabled state or data [0] until the second processor 12 reads the stored message, and so the first processor 10 is able to check through the check information CHa if another message may be written in the mail box.

When the second processor 12 which is informed of the stored message through the interrupt signal INTb reads the stored message, the interrupt signal INTb is disabled at a high level, and the check information CHa is changed to an enabled state at a high level or data [1].

Then, the first processor 10 stores another message in the mail box through the check information. As described above, the processor which sent a message in the mail box is informed of whether the corresponding processor has read the message, thereby preventing any message repetition or any overwriting to the mail box.

When a specific row address is applied, the structure described above may require a separate circuit which disables a specific word line corresponding to the shared memory area and enables the interface unit instead. Here, the separate circuit is called "register access circuit".

FIG. 18 illustrates a block diagram of an embodiment of a register access circuit.

As shown in FIG. 18, the register access circuit R100 comprises a register-address determination unit R110, a shared memory area-address determination unit R120, and a register access signal generation unit R130.

The register access circuit R100 is adapted to prevent an access to the memory cells corresponding to the specific address and to enable the DRAM interface unit. The register-address determination unit R110 determines if the applied address is for accessing the interface unit, so the unit enables the first enable signal (REG_ADD) when the applied address is the specific row address 1FFF800h~1FFFFFFh. In other words, when a row address other than the specific row address 1FFF800h~1FFFFFFh is applied, the first enabled signal REG_ADD is not generated.

The shared memory area-address determination unit R120 determines if a memory address, which is applied for selecting any memory area among the memory areas B1-B4, is a memory address for selecting the shared memory area. In other words, the shared memory area-address determination unit R120 enables a second enable signal SB when a memory address for selecting the shared memory address is applied. If the shared memory area is constructed of a bank memory area (for example, B bank), a bank address for selecting the bank B2 may be a memory address for selecting the shared memory area. The specific row address 1FFF800h.about.1FFFFFFh for the shared memory area is called the "register address".

A reason for the second enable signal SB is that the specific row address 1FFF800h~1FFFFFFh exists in every bank memory, and so there is a need to check if the address is for the shared memory area so as to specify the register address for the interface unit.

The register access signal generation unit R130 generates a register access signal REG_ACCESS in response to the first enable signal REG_ADD and the second enable signal SB.

The register access signal REG_ACCESS is generated only when both of the first enable signal REG_ADD and the second enable signal SB are enabled, and the register access signal is not generated when any one of the enable signals is not enabled. The register access signal REG_ACCESS enables first the interface unit R170. Registers constituting the interface unit R170 are therefore enabled.

Then, the register access signal REG_ACCESS causes word lines corresponding to the specific row address 1FFF800h~1FFFFFFh to be enabled. In other words, the register access signal causes a word line driving unit R140 not to generate a signal for enabling the word lines. This prevents an access to the memory cells connected to the word lines corresponding to the specific row address 1FFF800h~1FFFFFFh. Circuits constituting the word line drive unit R140 may include a sub word line driver, a normal word line enable signal (NWE) generation circuit, a word line selecting signal (PXI) generation circuit, etc. The register access signal REG_ACCESS may control operations of the sub word line driver, the normal word line enable signal (NWE) generation circuit, the word line selecting signal (PXI) generation circuit, etc. In other words, the register access signal REG_ACCESS may cause the driver and the circuits not to operate. Thus, the register access signal prevents generation of an enable signal for enabling the driver and the circuits.

Then, the register access signal REG_ACCESS disables a sensing/passing unit R150 for reading data. The sensing/passing unit R150 includes reading-related circuits which include a sense amplifier for operating to read data in memory cells. When the specific row address 1FFF800h~1FFFFFFh is applied, signals for enabling the sensing/passing unit R150 related to the reading for sensing data of memory cells corresponding to the address are generated. Accordingly, the register access signal can disable the sensing/passing unit R150 when the specific row address 1FFF800h~1FFFFFFh is applied. Although the register access signal REG_ACCESS disables the sensing/passing unit R150, it enables the data passing unit R160 which should not be disabled so as to store information in registers constituting the interface unit R170. If the DRAM has a structure adapted to cause the sensing/passing unit R150 and the data passing unit R160 to be simultaneously enabled or disabled, the register access signal causes a control signal for controlling the enabling of the units to be in a disabled state, and causes a signal for enabling the data passing unit R160 to be generated separately.

In summary, the register access signal REG_ACCESS enables circuits related to an operation of the interface unit, and disables circuits which are required when word lines corresponding to the specific row address are enabled.

As described above, in the multipath accessible semiconductor memory device comprising the interface unit in a DRAM, when the register address for enabling the interface unit is input, the word lines corresponding to the address are disabled. In addition, the memory device may reduce the electricity consumed by disabling the sensing/passing unit which is not related to the interface operation.

Although some embodiments of the invention are described above with reference to the drawings, it will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, a configuration of register or bank within a memory, or a circuit configuration and an access method may be changed in many ways without deviating from the spirit or scope of the invention.

For example, with four memory areas, one may be designated as a shared memory area and the other three may be designated as private memory areas, or all of four may be designated as shared memory areas. Further, a system employing two processors was described above as the example, but in a system employing three or more processors, three or more ports may be coupled to one DRAM, and at a specific time, one of the three processors may access a determined shared memory. Furthermore, the DRAM was provided as the example in the above description, but the invention is not limited to that, and the scope of the invention is extendable to a static random access memory or nonvolatile memory, etc.

As described above, in a semiconductor memory device according to some embodiments of the invention, a host interface between processors is provided through the interior of a memory, thus a shared memory area can be accessed by a plurality of processors at high speed. Thus a data transmission and processing speed can be improved, the size of a system can be reduced, and the number of memories can be reduced, substantially reducing the cost of memories in the system.

By providing a check register or a separate pin for a checking operation, one processor is able to recognize if another processor has read a message stored in the mail box, thereby preventing any message repetition or overwriting of a message in the mail box.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A semiconductor memory device, comprising:
    a memory cell array having a shared memory area operationally coupled to two or more ports that are independently accessible by two or more processors;
    an access path forming unit to form a data access path between one of the ports and the shared memory area in response to external signals applied by the processors; and
    an interface unit having a semaphore area and mailbox areas accessible in the shared memory area by the two or more processors to provide an interface function for communication between the two or more processors, wherein
    the access path forming unit comprises:
        a path decision unit to logically combine the external signals and generate a path decision signal;
        a row and column address multiplexer for selecting one row and one column address from row and column addresses respectively applied through the ports in response to the path decision signal, and applying the address to each of a row decoder and a column decoder coupled to the shared memory area;
        first and second global multiplexers for connecting a global input/output line of the shared memory area to a first data input/output line, or the global input/output line of the shared memory area to a second data input/output line, in response to the path decision signal; and
        an input/output related path unit including a first input/output related circuit coupled between the first global multiplexer and a first one of the ports, and a second input/output related circuit coupled between the second global multiplexer and a second port one of the ports.

2. The device of claim 1, wherein the first input/output related circuit comprises:
    a data output path circuit including an input/output sense amplifier operationally connected to the first global multiplexer, a data multiplexer operationally coupled to the input/output sense amplifier, a data output buffer connected to the data multiplexer, and a data output driver connected to the data output buffer to drive output data; and a data input path circuit including a data input buffer in the first port, a first input driver connected to the data input buffer to primarily drive write data, and a second input driver connected to the first input driver to secondarily drive the write data.

3. The device of claim 2, wherein a plurality of memory cells disposed in a matrix of rows and columns in the shared memory area are DRAM (Dynamic Random Access Memory) cells each of which includes an access transistor and a storage capacitor.

4. The device of claim 3, wherein the path decision unit logically combines a row address strobe signal, a write enable signal and a bank selection address individually applied through the ports, and generates the path decision signal.

5. The device of claim 3, wherein the two or more processors share, through the ports, the global input/output line of the shared memory area, a local input/output line operationally coupled to the global input/output line, a bit line operationally connected to the local input/output line by a column selection signal, a bit line sense amplifier coupled to the bit line to sense and amplify data from the bit line, and a memory cell connected to an access transistor forming a memory cell on the bit line.

6. The device of claim 2, wherein two input/output sense amplifiers are disposed in the shared memory area.

7. The device of claim 2, wherein the first and second global multiplexers have mutually opposed switching operations.

8. The device of claim 1, wherein memory cells coupled to a specific word line of the shared memory area are all disabled when the interface unit is accessed by a specific address.

9. The device of claim 8, wherein the interface unit includes an internal buffer, and
the semaphore area and the mailbox areas are, accessed by a column address when the specific address is a row address.

10. The device of claim 9, wherein the semaphore area and the mailbox areas each have 16 bits of storage area.

11. The semiconductor memory device according to claim 1, wherein the mailbox areas accessible in the shared memory area enables a first signal indicating that data has been received and can be read from the mailbox areas, and then disables the first signal to indicate that data has been read and new data can be written to the mailbox areas.

12. A semiconductor memory device, comprising:
at least one memory cell array having a shared memory area operationally coupled to two or more ports that are independently accessible by two or more processors; and
an interface unit having a semaphore area, mail box areas and check areas which are individually accessible in response to a specific address of the shared memory area so as to provide an interface function for communication between the processors, wherein
each mailbox area stores a message such as an authority request or a data/command transmission to be sent from a first processor to a second processor according to a predetermined transmission direction.

13. The device of claim 12, wherein memory cells in the shared memory area are disposed in a matrix form and comprise DRAM memory cells, each cell having an access transistor and a storage capacitor.

14. The device of claim 13, wherein when the interface unit is accessed by the specific address, memory cells connected to a corresponding word line of the shared memory area are disabled.

15. The device of claim 14, wherein the interface unit is commonly enabled when the specific address is applied, and the semaphore area, the mail box areas and the check areas are accessed in response to individual column addresses.

16. The device of claim 14, further comprising a register access circuit to prevent an access to memory cells corresponding to the specific address and to enable the interface unit.

17. The device of claim 16, wherein the register access circuit comprises:
a register-address determination unit to determine if an applied address is for accessing the interface unit, and to enable the first enable signal when the address is the specific address;
a shared memory area-address determination unit to determine if a memory address for selecting any memory area among the memory areas is a memory address for selecting the shared memory area, the shared memory area-address determination unit enabling a second enable signal when the memory address is for selecting the shared memory address; and
a register access signal generation unit to generate a register access signal in response to the first enable signal and the second enable signal.

18. The device of claim 17, wherein the register access signal disables a word line
drive circuit which comprises circuits for enabling a word line corresponding to the specific address, and disables a sensing/passing unit which has reading-related circuits comprising a sense amplifier for reading data in memory cells connected to the word line, and enables a data passing unit comprising writing-related circuits and input/output lines for inputting/outputting data.

19. The device of claim 18, wherein the word line drive unit comprises a sub word line driver, a normal word line enable signal generation circuit, and a word line selecting signal generation circuit.

20. The device of claim 19, wherein the register access signal prevents generation of enable signals for enabling the word line drive unit.

21. The device of claim 13, wherein an interrupt signal is generated to inform the second processor that the message is stored in the mail box.

22. The device of claim 21, wherein the interrupt signal is enabled when the message is written in the mail box, and disabled when the second processor has read the message stored in the mail box.

23. The device of claim 22, wherein the check area stores information indicating if the second processor has read the message stored in the mail box.

24. The device of claim 23, wherein the information stored in the check area is monitored by one or more other processors other than the second processor.

25. The device of claim 12, wherein a mail box area and a check area are provided for each port.

26. The device of claim 12, wherein the semaphore area and each of the mail box areas have a 16 bit storage area respectively, and the check areas respectively have a 1 or 2 bit storage area when the semiconductor memory device has two ports.

27. The device of claim 12, wherein the semaphore area has a 4 bit storage area, and the mail box areas respectively have a 32 bit storage area, and the check areas respectively have a 1 or 2 bit storage area when the semiconductor memory device has two ports.

28. A semiconductor memory device, comprising:

at least one memory cell array having a shared memory area operationally coupled to two or more ports that are independently accessible by two or more processors; and an interface unit having a semaphore area and mail box areas which are individually accessible to provide an interface function for communication between the processors, wherein the interface unit provides a first interrupt signal to a first one of the ports and a corresponding first check signal to a second one of the ports, and the interface unit provides a second interrupt signal to the second one of the ports and a corresponding second check signal to the first one of the ports.

29. The device of claim 28 wherein the check signals have the same phase as the corresponding interrupt signals.

30. The device of claim 28 wherein:

the first interrupt signal and the first check signal are enabled when a processor coupled to the second one of the ports writes a message to a mail box; and the first interrupt signal and the first check signal are disabled when a processor coupled to the first one of the ports reads the message from the mail box.

31. A portable communication system, comprising: a first processor for performing a first determined task;

a second processor for performing a second determined task; and a random access memory including a memory cell array, first and second ports, an access path forming unit and a register unit, the memory cell array having a shared memory area accessible by both the first and second processors and first and second private memory areas accessible only by the respective first and second processors, the first and second ports each coupled to corresponding buses of the first and second processors, the access path forming unit to form a data access path between one of the ports and the shared memory area in response to external signals applied from the first and second processors, and the register unit having a semaphore area and mailbox areas opposedly accessible to provide an interface function for communication between the first and second processors.

32. The system of claim 31, wherein the semaphore area and mailbox areas correspond to a specific address of the shared memory area.

33. The system of claim 31, wherein:

the shared memory area may be accessed only by one of the processors that has gained control authority for the shared memory area; and the mailbox areas may be accessed at any time by both of the processors regardless of the control authority.

34. A method for providing a host interface between processors, comprising:

coupling each of the processors to a multi path accessible semiconductor memory device having a shared memory area, the shared memory area operationally coupled to two or more ports and independently accessible by each of the processors;

forming a data access path by an access path forming unit, between one of the ports and the multi path accessible semiconductor memory device in response to external signals applied by the processors; and performing data communication between the processors through an interface unit in the shared memory area, the interface unit having a semaphore area and mailbox areas commonly accessible by the processors, wherein:

the shared memory area may be accessed only by one of the processors that has wined control authority for the shared memory area and the mailbox areas may be accessed at anytime by both of the processors regardless of the control authority.

35. The method of claim 34, wherein the interface unit is mapped to a specific address in the shared memory area.

36. The method of claim 34, wherein a first one of the processors may gain control authority for the shared memory area by: writing data to one of the mailbox areas; and periodically checking the semaphore area.

37. The method of claim 36, wherein a second one of the processors may write data to the semaphore area to release control of the shared memory area.

* * * * *